US006486812B1

(12) United States Patent
Tanaka

(10) Patent No.: US 6,486,812 B1
(45) Date of Patent: Nov. 26, 2002

(54) D/A CONVERSION CIRCUIT HAVING N SWITCHES, N CAPACITORS AND A COUPLING CAPACITOR

(75) Inventor: Yukio Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/633,008

(22) Filed: Aug. 4, 2000

(30) Foreign Application Priority Data

Aug. 16, 1999 (JP) ............................ 11-229802

(51) Int. Cl.$^7$ ................................. H63M 1/66
(52) U.S. Cl. .................... 341/144; 341/172; 341/136; 341/141; 341/155; 341/158; 341/161; 349/100; 349/122; 438/150; 438/162; 438/166
(58) Field of Search .................. 341/144, 145, 341/172, 155, 158, 161, 136

(56) References Cited

U.S. PATENT DOCUMENTS

| | | | | |
|---|---|---|---|---|
| 4,843,393 A | * | 6/1989 | Kuraishi ................. | 341/145 |
| 5,581,252 A | * | 12/1996 | Thomas .................. | 341/144 |
| 5,594,569 A | | 1/1997 | Konuma et al. ........... | 349/122 |
| 5,643,826 A | | 7/1997 | Ohtani et al. ............ | 437/88 |
| 5,719,576 A | * | 2/1998 | Draxelmayr ............. | 341/118 |
| 5,767,801 A | * | 6/1998 | Okamoto ................ | 341/145 |
| 5,835,045 A | * | 11/1998 | Ogawa et al. ........... | 341/155 |
| 5,847,669 A | * | 12/1998 | Kochi .................... | 341/141 |
| 5,889,486 A | * | 3/1999 | Opris et al. ............. | 341/144 |
| 5,923,962 A | | 7/1999 | Ohtani et al. ........... | 438/150 |
| 6,169,508 B1 | * | 1/2001 | Edwards ................. | 341/144 |
| 6,400,299 B2 | * | 6/2002 | Ikeda ..................... | 341/144 |

FOREIGN PATENT DOCUMENTS

JP  7-130652  5/1995

OTHER PUBLICATIONS

English Abstract re Japanese patent application No. JP 7-130652, published May 19, 1995.
Azami, M. et al, "A 2.6–in. DTV TFT–LCD with Area–Reduced Integrated 8–bit Digital Data Drivers Using 400–Mobility CGS Technology," *SID 99 Digest*, pp. 6–9, 1999.
Inui, S. et al, "Thresholdless Antiferroelectricity in Liquid Crystals and its Application to Displays," J. Mater. Chem., vol. 6, No. 4, pp. 671–673, 1996.
Matsueda, Y. et al, "Low Temperature Poly–Si TFT–LCD with Integrated 6–Bit Digital Data Drivers," SID 96 Digest, pp. 21–24, 1996.
Yoshida, T. et al, "A Full–Color Thresholdless Antiferroelectric LCD Exhibiting Wide Viewing Angle with Fast Response Time," SID 97 Digest, pp. 841–844, 1997.
Furue, H. et al, "Characteristics and Driving Scheme of Polymer–Stabilized Monostable FLCD Exhibiting Fast Response Time and High Contrast Ratio with Gray–Scale Capability," SID 98 Digest, pp. 782–785, 1998.
Koyama, J. et al, "A 4.5–in Full–Color VGA Poly–Si TFT–LCD with Integrated Drivers," SID 98 Digest, pp. 883–886, 1998.

(List continued on next page.)

*Primary Examiner*—Michael Tokar
*Assistant Examiner*—Lam T. Mai
(74) *Attorney, Agent, or Firm*—Cook, Alex, McFarron, Manzo, Cummings & Mehler, Ltd.

(57) ABSTRACT

A D/A conversion circuit is described which comprises a n switching, n capacitors and a coupling circuit. Upper n bit of the digital signal control n switches respectively and control charging and discharging of electric charge into the n capacitors, and the n capacitors are connected to the output line in an upper bit writing period. Lower n bit of the digital signal control the n switches and control charging and discharging of electric charge into the n capacitors, and the capacitors are connected to the output line through the coupling capacitor in a lower bit writing period.

9 Claims, 19 Drawing Sheets

OTHER PUBLICATIONS

Matsueda, Y. et al, "A 6–Bit Color VGA Low–Temperature Poly–Si TFT–LCD with Integrated Digital Data Drivers," SID 98 Digest, pp. 879–882, 1998.

Osame, M. et al, "A 2.6–in Poly–Si TFT–LCD HDTV Display with Monolithic Integrated 8–Bit Digital Data Drivers," SID 98 Digest, pp. 1059–1062, 1998.

Ohtani, H. et al, "Late News Poster: A 60–in HDTV Rear–Projector with Continuous Grain–Silicon Technology," SID 98 Digest, pp. 467–470, 1998.

Koyama, J. et al, "A 4.0–in Poly Si TFT–LCD with Integrated 6–Bit Digital Data Driver Using CGS Technology," AM–LCD '99, pp. 29–32, 1999.

Azami, M. et al, "CGS–TFT–LCD as a Display Element for a Projector," FPD Intelligence 1999, vol. 11, pp. 76–79, 1999.

* cited by examiner

Fig. 6A Immediately after reset period
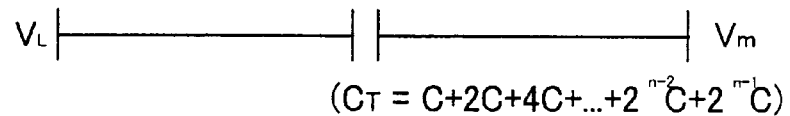
$(C_T = C+2C+4C+...+2^{n-2}C+2^{n-1}C)$
Fig. 6B Upper bit writing period (Phase 1)
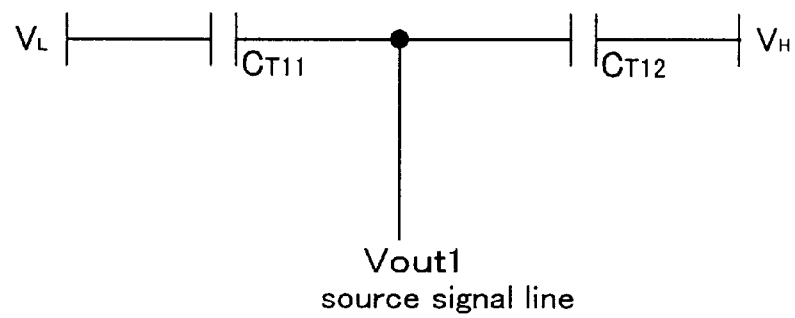
Vout1
source signal line
Fig. 6C Immediately after soft reset period
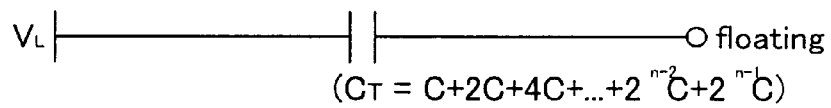
$(C_T = C+2C+4C+...+2^{n-2}C+2^{n-1}C)$
Fig. 6D Lower bit writing period (Phase 2)
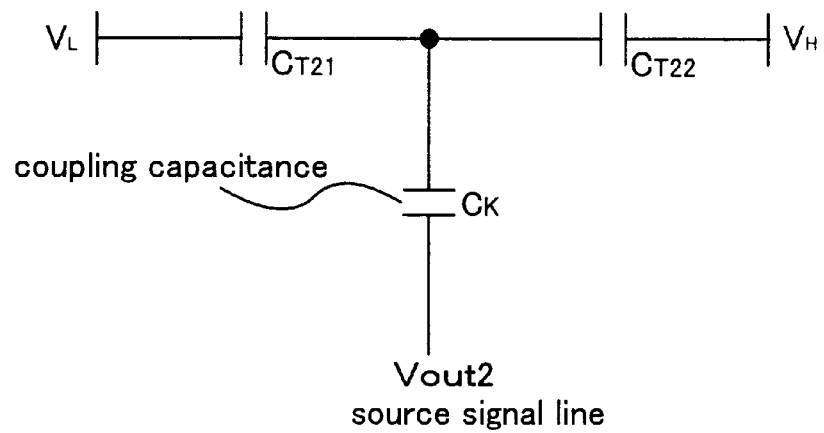
coupling capacitance
Vout2
source signal line

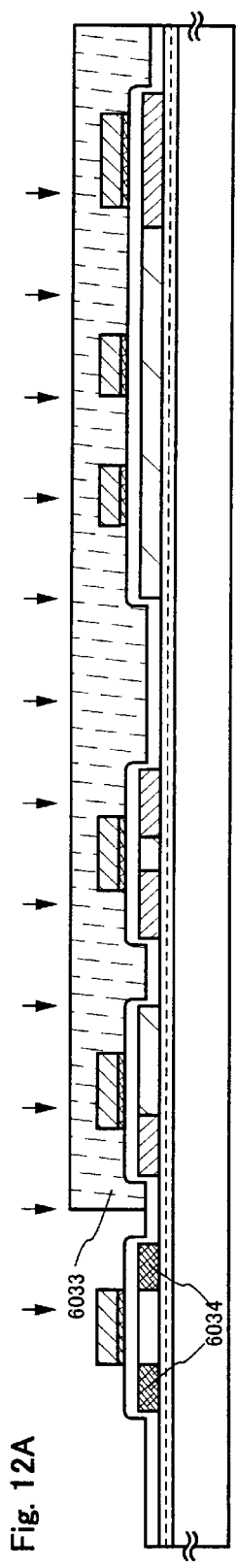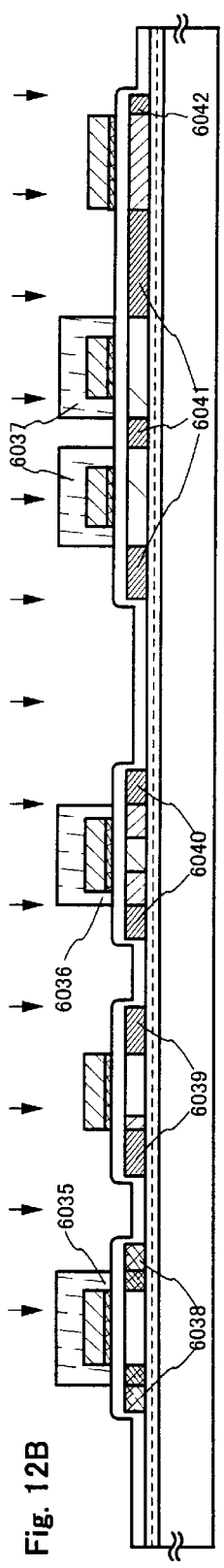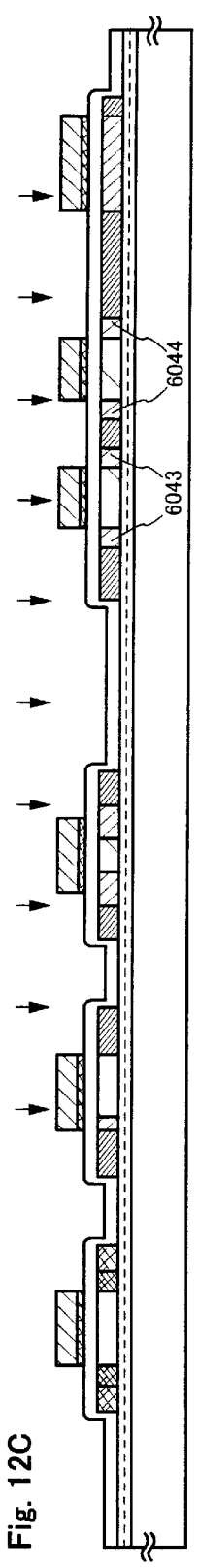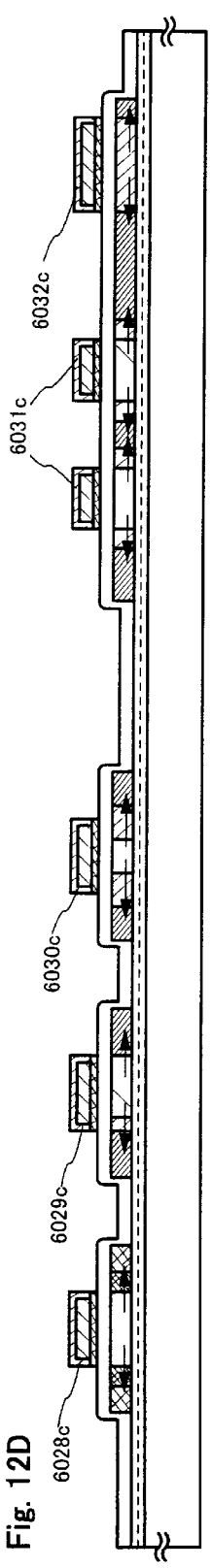

Fig. 16A immediately after reset period
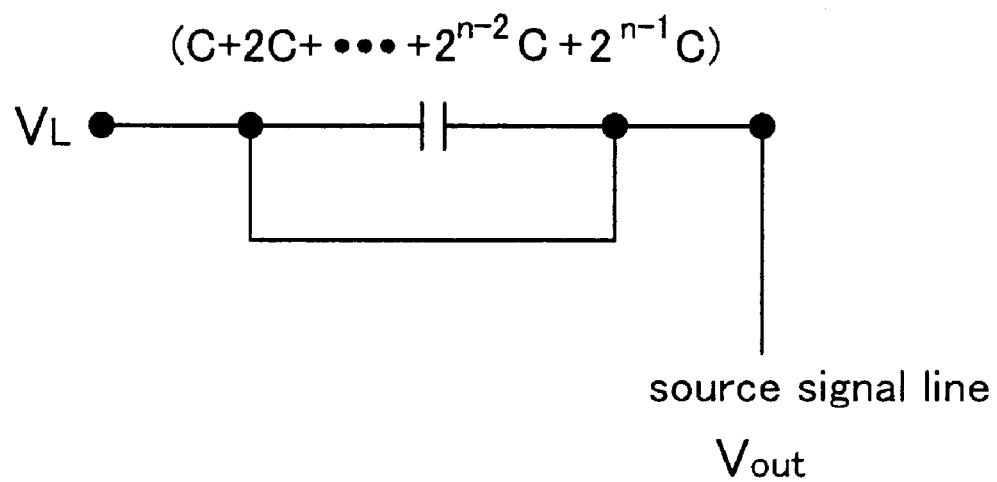
Fig. 16B writing period
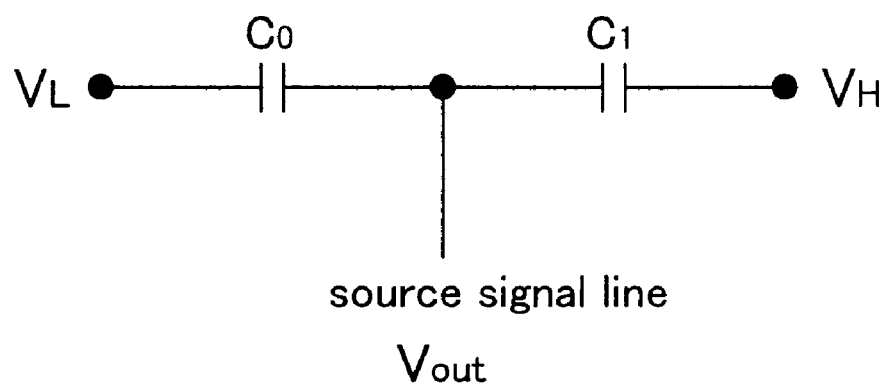

D/A CONVERSION CIRCUIT HAVING N SWITCHES, N CAPACITORS AND A COUPLING CAPACITOR

BACKGROUND OF THE INVENTION

1. Field of the Invention

The present invention relates to a D/A conversion (Digital/Analog conversion) circuit (DAC). Particularly, the invention relates to a DAC used for a driving circuit of a semiconductor device. Besides, the invention relates to a semiconductor device using this DAC.

2. Description of the Related Art

Recently, a technique of fabricating a semiconductor device in which a semiconductor thin film is formed on an inexpensive glass substrate, such as a thin film transistor (TFT), has been rapidly developed. This is because the demand for an active matrix type liquid crystal display device has been increased.

In the active matrix type liquid crystal display device, a pixel TFT is disposed for each of several tens to several million pixel regions arranged in matrix form, and an electric charge going in and out of a pixel electrode connected to each pixel TFT is controlled by the switching function of the pixel TFT.

Especially, with the improvement in fineness and picture quality of a display device, attention has been paid on a digital driving system active matrix type liquid crystal display device which can be driven at high speed.

The digital driving system active matrix type liquid crystal display device requires a D/A conversion circuit (DAC) for converting a digital signal inputted from the outside into an analog signal (gray scale voltage). Although there are various kinds of D/A conversion circuits, an example of a DAC used for the active matrix type liquid crystal display device will be described here.

Reference will be made to FIG. 15. FIG. 15 shows an example of a conventional DAC. The conventional DAC shown in FIG. 15 includes n switches ($SW_0$ to $SW_{n-2}$) controlled by respective bits of an n-bit digital signal ($D_0$ to $D_{n-1}$), capacitors (C, 2C, . . . , $2^{n-1}C$) connected to the respective switches ($SW_0$ to $SW_{n-1}$), and a reset switch $SW_R$. Besides, a power source H and a power source L are connected to this conventional DAC. A potential $V_{out}$ of an analog signal outputted from the DAC is given to a source signal line (output line).

When the applied digital signal ($D_0$ to $D_{n-1}$) is 0 (Lo), the switches ($SW_0$ to $SW_{n-1}$) are respectively connected to the power source L, and when the applied digital signal ($D_0$ to $D_{n-1}$) is 1 (Hi), they are respectively connected to the power source H.

The operation of this conventional DAC will be described in sequence. The operation of this conventional DAC is divided into a reset period $T_R$ and a writing period $T_E$, and the description will be made on the respective periods.

First, in the reset period $T_R$, the reset switch $SW_R$ is closed, and all the bits ($D_0$ to $D_{n-1}$) of the digital signal become 0 (Lo), so that all the switches ($SW_0$ to $SW_{n-1}$) are connected to the power source L. An equivalent circuit diagram of this conventional DAC in this state is shown in FIG. 16A.

Immediately after the completion of the reset period $T_R$, all the bits ($D_0$ to $D_{n-1}$) of the digital signal is 0 (Lo). After the completion of the reset period $T_R$, the writing period $T_E$ starts, and the digital signal ($D_0$ to $D_{n-1}$) having arbitrary bit information of 0 (Lo) or 1 (Hi) controls the switches ($SW_0$ to $SW_{n-1}$) Then, an electric charge corresponding to each bit information is charged/discharged, and thereafter, a steady state is attained. An equivalent circuit diagram at this time is shown in FIG. 16B.

A digital signal can be converted into an analog signal by repeating the foregoing operation of the reset period $T_R$ and the writing period $T_E$.

In recent years, a liquid crystal panel included in an active matrix type liquid crystal display device is demanded to be made thin and lightweight, and at the same time, high precision, high picture quality, and high luminance have been also demanded. Thus, it is desired that the area of a D/A conversion circuit is made small.

However, a driving circuit including the D/A conversion circuit as described above must include the n switches, n capacitors, and one reset switch in order to convert the n-bit digital signal to the analog signal. Thus, it is difficult to prevent its area from increasing, which is one of the causes of the obstruction to the miniaturization of a semiconductor device, particularly, an active matrix type liquid crystal display device.

Besides, for the purpose of attaining high precision of a semiconductor device, it becomes necessary to increase the number of pixels, that is, the number of source signal lines. However, as described above, if the number of source signal lines is increased, the number of D/A conversion circuits is also increased, and the area of the driving circuit is increased, which prevents the improvement in high precision.

From the reasons described above, a D/A conversion circuit having a small area has been required.

SUMMARY OF THE INVENTION

The present invention has been made in view of the above problems, and has an object to provide a D/A conversion circuit which can make its area small. The DAC of the invention will be described below.

The present invention relates to a DAC for converting a 2n-bit digital signal into an analog signal, and is characterized in that the 2n-bit digital signal is divided into upper n bits and lower n bits, and after the upper n bits are inputted to the DAC, the lower n bits are inputted to the DAC. When the digital signal of the upper n bits is inputted to the DAC, one electrode of each of n capacitors with capacitance value expressed by $2^{n-1}$ C (C is a constant) is connected to a power source L or a power source H. A potential $V_{out1}$ of an analog signal by upper bit information is given from the DAC to a source signal line connected to the other electrode of each of the n capacitors. Subsequently, the digital signal of the lower n bits is inputted to the DAC, so that the one electrode of each of the n capacitors is connected to the power source L or the power source H. A potential $V_{out2}$ of an analog signal by the lower bit information from the DAC is given to the source signal line connected to the other electrode of each of the n capacitors through a coupling capacitor $C_k$ having a constant capacitance value.

Like this, after the analog signal by the upper bit information is written to the source signal line, the analog signal by the lower bit information is further written, so that the analog signal by the upper bit information is combined with the analog signal by the lower bit information to form an analog signal and it can be inputted to the source signal line.

The capacitance value of the coupling capacitor $C_k$ can be suitably set by a designer so that the analog signal outputted from the DAC is linearly changed by changing bit information of the digital signal.

Since the present invention has the foregoing structure, it has become possible to convert the 2n-bit digital signal into the analog signal by the DAC using the n capacitors and one coupling capacitor $C_k$. Thus, the size of the DAC can be made approximately half of the size of a conventional DAC. As a result, the area of a driving circuit can be made small, and it has become possible to make a liquid crystal panel included in an active matrix type liquid crystal display device thin and lightweight. Besides, even if the number of source signal lines is increased and the number of D/A conversion circuits is increased, since the area of the D/A conversion circuit can be made small, the increase of the area of a driving circuit by higher precision can be made small as compared with the case using the conventional DAC.

Incidentally, the DAC of the present invention is not limited to only an active matrix type liquid crystal display device, but can also be used for a display device having, for example, an EL (electroluminescence) element.

The structure of the DAC of the present invention is described below.

According to an aspect of the present invention, a D/A conversion circuit for converting a 2n-bit digital signal (n is a natural number) into an analog signal includes n n switches, n capacitors, and a coupling capacitor, wherein in an upper bit writing period, upper n bits of the digital signal respectively control the n switches to control charging and discharging of electric charges to the n capacitors, and the n capacitors are connected to an output line, and in a lower bit writing period, lower n bits of the digital signal respectively control the n switches to control charging and discharging of electric charges to the n capacitors, and the n capacitors are connected to the output line through the coupling capacitor.

According to another aspect of the present invention, a D/A conversion circuit for converting a 2n-bit digital signal (n is a natural number) into an analog signal includes n switches, n capacitors, and a coupling capacitor, wherein in a first period, one of two electrodes of each of the n capacitors is connected to a first power source, and the other electrode is connected to a third power source;

in a second period, upper n bits of the digital signal respectively control the n switches, the one electrode is connected to the first power source or a second power source, and the other electrode is connected to an output line;

in a third period, the one electrode is connected to the first power source, and the other electrode becomes floating; and in a fourth period, lower n bits of the digital signal respectively control the n switches, the one electrode is connected to the first power source or the second power source, and the other electrode is connected to the output line.

According to still another aspect of the present invention, a semiconductor device comprising a source signal line driving circuit, a gate signal line driving circuit, and a pixel portion, wherein the source signal line driving circuit includes a D/A conversion circuit for converting a 2n-bit digital signal (n is a natural number) into an analog signal, wherein the D/A conversion circuit comprises n switches, n capacitors, and a coupling capacitor, and wherein in an upper bit writing period, upper n bits of the digital signal respectively control the n switches to control charging and discharging of electric charges to the n capacitors, and the n capacitors are connected to an output line, and in a lower bit writing period, lower n bits of the digital signal respectively control the n switches to control charging and discharging of electric charges to the n capacitors, and the n capacitors are connected to the output line through the coupling capacitor.

According to still another aspect of the present invention, a semiconductor device which comprises a source signal line driving circuit, a gate signal line driving circuit, and a pixel portion, wherein the source signal line driving circuit includes a D/A conversion circuit for converting a 2-bit digital signal (n is a natural number) into an analog signal, wherein the D-A conversion circuit comprises n switches, n capacitors, and a coupling capacitance, and wherein in a first period, one of two electrodes of each of the n capacitors is connected to a first power source, and the other electrode is connected to a third power source;

in a second period, upper n bits of the digital signal respectively control the n switches, the one electrode is connected to the first power source or a second power source, and the other electrode is connected to an output line;

in a third period, the one electrode is connected to the first power source, and the other electrode becomes floating; and in a fourth period, lower n bits of the digital signal respectively control the n switches, the one electrode is connected to the first power source or the second power source, and the other electrode is connected to the output line.

Power source potential $V_L$ of the first power source may be lower than power source potential $V_H$ of the second power source.

The switch may include a thin film transistor.

Besides, there is provided a rear projector, a front projector, a goggle display, a mobile computer, a notebook personal computer, a video camera, a DVD player, or a game machine each including the D/A conversion circuit.

BRIEF DESCRIPTION OF THE DRAWINGS

FIGS. 6A to 6D are equivalent circuit diagrams of the DAC of the present invention.

FIGS. 12A to 12D are sectional views showing the manufacturing process of the TFT.

FIGS. 16A and 16B are equivalent circuit diagrams of the conventional DAC.

DETAILED DESCRIPTION OF THE PREFERRED EMBODIMENTS

An embodiment of a DAC of the present invention will be described below. Incidentally, the DAC of the present invention is not limited to the following embodiment.

Figure 1:
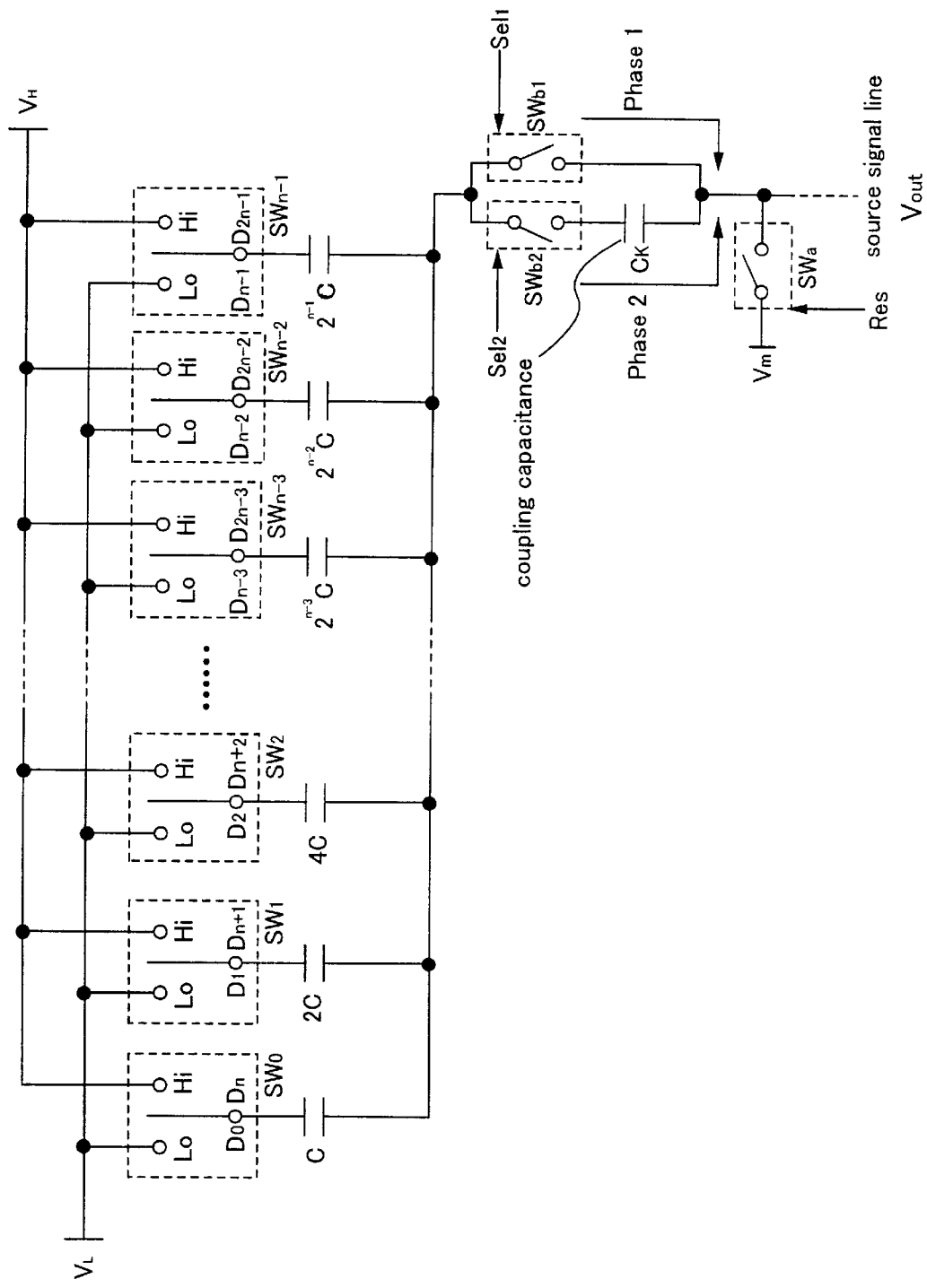
FIG. 1 is a circuit diagram of a DAC of the present invention.

FIG. 1 is a circuit diagram of a DAC of the present invention. The DAC of the present invention shown in FIG. 1 can process a digital signal of 2n bits ($D_0$ to $D_{2n-1}$).

In the digital signal, $D_0$ is made the LSB (Least Significant Bit) and $D_{2n-1}$ is made the MSB (Most Significant Bit). In the present specification, the 2-bit digital signal is divided into upper n bits ($D_0$ to $D_{2n-1}$) and lower n bits ($D_0$ to $D_{n-1}$). The value of the digital signal ($D_0$ to $D_{2n-1}$) is either one of Hi and Lo.

As shown in FIG. 1, the DAC of the present invention includes n switches ($SW_0$ to $SW_{n-1}$) controlled by respective bits of the 2n-bit digital signal ($D_0$ to $D_{2n-1}$), capacitors ($C, 2C, \ldots, 2^{n-1}C$) connected to the respective switches ($SW_0$ to $SW_{n-1}$), a reset switch SWa, selection switches $SWb_1$ and $SWb_2$, and a coupling capacitor $C_k$. Incidentally, C indicates unit capacitance and is a constant.

When the inputted digital signal ($D_0$ to $D_{2n-1}$) is 0 (Lo), the switches ($SW_0$ to $SW_{n-1}$) respectively connects a power source $V_L$ and the capacitors ($C, 2C, \ldots, 2^{n-1}C$), and when the inputted digital signal ($D_0$ to $D_{2n-1}$) is 1 (Hi), they connect a power source $V_H$ and the capacitors ($C, 2C, \ldots, 2^{n-1}C$). For convenience of explanation, it is defined that the value of the digital signal is 1 when it is Hi, and the value of the digital signal is 0 when it is Lo.

By a reset signal (Res) inputted to the reset switch SWa, charging of electric charges from a power source M to the capacitors ($C, 2C, \ldots, 2^{n-1}C$) is controlled.

By writing selection signals 1 and 2 ($Sel_1, Sel_2$) inputted to the selection switches $SWb_1$ and $SWb_2$, it is selected whether the capacitors ($C, 2C, \ldots, 2^{n-1}C$) are directly connected to a source signal line, or whether the coupling capacitor $C_k$ is connected in series between the capacitors and the source signal line.

The writing selection signal 1 ($Sel_1$) is inputted to the $SWb_1$, and the writing selection signal 2 ($Sel_2$) is inputted to the $SWb_2$. The reset signal (Res) is inputted to the SWa. When the selection signal 1 ($Sel_1$), the selection signal 2 ($Sel_2$), and the reset signal (Res) are respectively Hi(1), the $SWb_1$, the $SWb_2$, and the SWa are respectively turned on.

On the contrary, when the selection signal 1 ($Sel_1$), the selection signal 2 ($Sel_2$), and the reset signal (Res) are respectively Lo(0), the $SWb_1$, the $SWb_2$, and the SWa are respectively turned off.

The DAC of the present invention is connected with the power source L (first power source), the power source H (second power source), and a reset power source M (third power source). In this specification, it is defined that the power source voltage of the power source H is $V_H$, the power source voltage of the power source L is $V_L$, and the power source voltage of the reset power source M is $V_M$. Incidentally, the phase of an analog signal outputted from the DAC in the case of $V_H > V_L$ is opposite to that in the case of $V_H < V_L$. Here, the output in the case of $V_H > V_L$ is made a positive phase, and the output in the case of $V_H < V_L$ is made an inversion phase.

The operation of the DAC of the present invention comprises a reset period for resetting electric charges held by the capacitors, an upper bit writing period (Phase 1) for inputting the upper n-bit digital signal to the switches, a soft reset period for causing the potential of one electrode of the capacitor connected to the power source H or the power source L in the Phase 1 to be the power source potential $V_L$, and a lower bit writing period (Phase 2) for inputting the lower n-bit digital signal to the switches.

Figure 2:
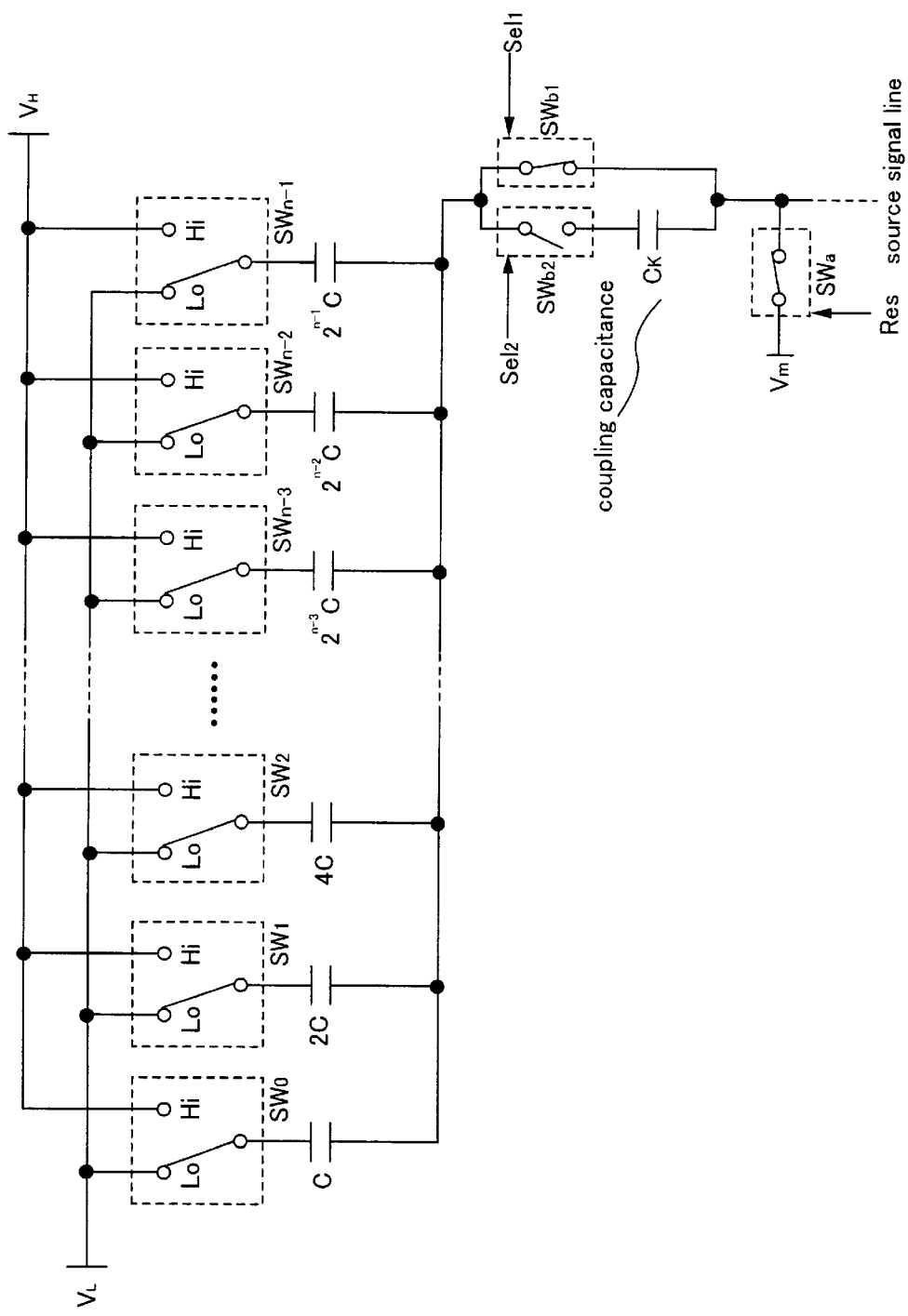
FIG. 2 is a circuit diagram of the DAC of the present invention.

FIG. 2 is a circuit diagram of the DAC of the present invention in the reset period. FIG. 6A is an equivalent circuit diagram of the DAC of the present invention shown in FIG. 2. In the reset period, the signal of 0 (Lo) is inputted to all the switches ($SW_0$ to $SW_{n-1}$). As a result, by the n switches ($SW_0$ to $SW_{n-1}$), one electrode of each of the capacitors ($C, 2C, \ldots, 2^{n-1}C$) is connected to the power source L, and the power source voltage $V_L$ is applied. In FIG. 6A, a capacitor $C_T$ indicates a composite capacitor of the capacitors ($C, 2C, \ldots, 2^{n-1}C$) to which the power source voltage $V_L$ is applied.

The writing selection signal 1 ($Sel_1$) of Hi(1) is inputted to the $SWb_1$ and it is turned on, the writing selection signal 2 ($Sel_2$) of Lo(0) is inputted to the $SWb_2$ and it is turned off, and the reset signal (Res) of Hi(1) is inputted to the SWa and it is turned on. As a result, the other electrode of each of the capacitors ($C, 2C, \ldots, 2^{n-1}C$) is connected to the power source M and the power source voltage $V_M$ is applied.

Figure 3:
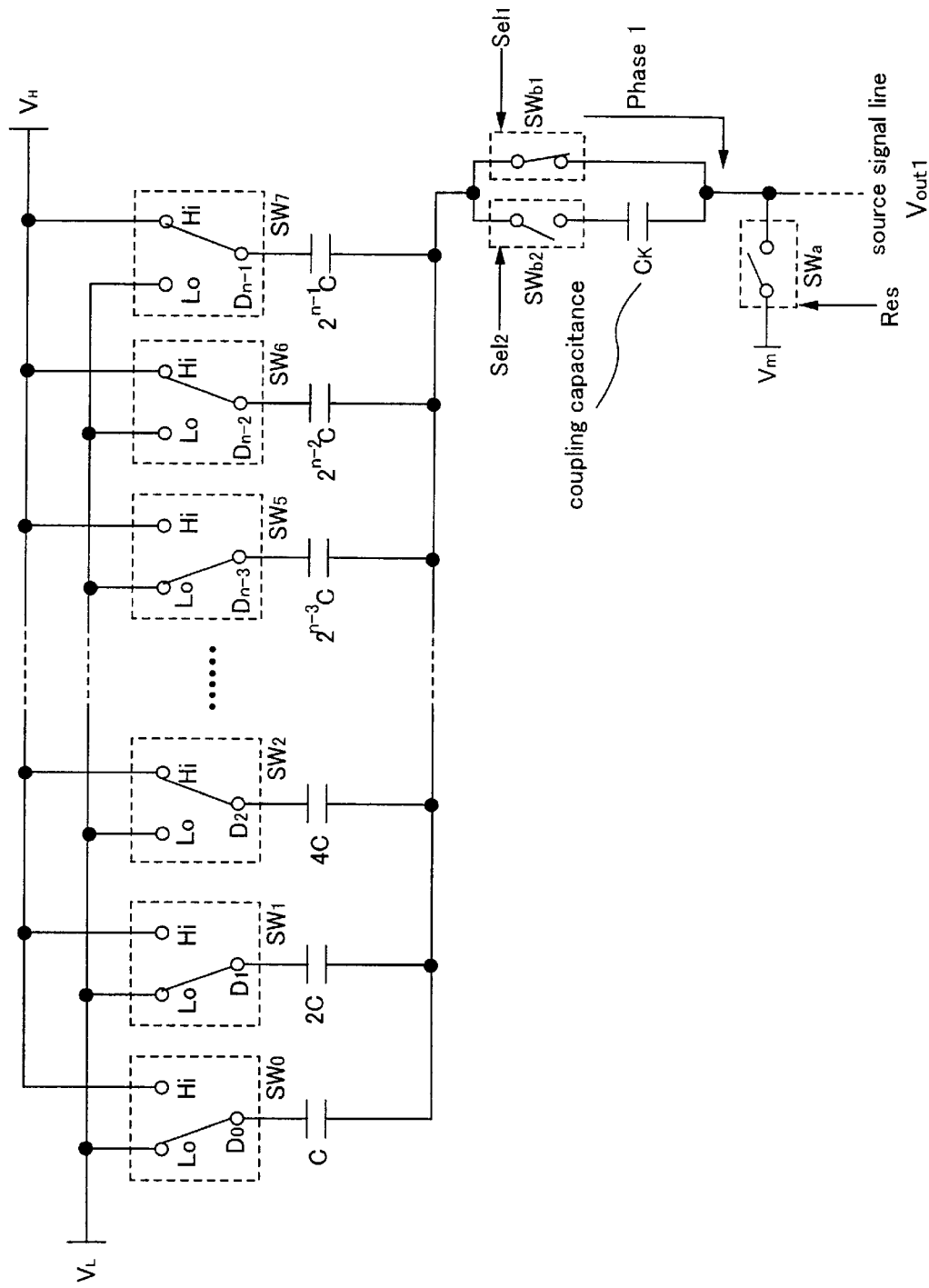
FIG. 3 is a circuit diagram of the DAC of the present invention.

FIG. 3 is a circuit diagram of the DAC of the present invention in the upper bit writing period (Phase 1). FIG. 6B is an equivalent circuit diagram of the DAC of the present invention shown in FIG. 3.

After the completion of the reset period, in the upper bit writing period (Phase 1), each of the upper n bits ($D_0$ to $D_{2n-1}$) of the digital signal has arbitrary bit information of 1 or 0. The upper n bits ($D_0$ to $D_{2-1}$) of the digital signal are respectively inputted to the n switches ($SW_0$ to $SW_{n-1}$). As a result, the one electrode of each of the capacitors ($C, 2C, \ldots, 2_{n-}C$) is ta connected to the power source L or Power source H by the n switches ($SW_0$ to $SW_{n-1}$), and the power source voltage $V_L$ or $V_H$ is applied. In FIG. 6B, a capacitor $C_{T11}$ indicates a composite capacitor of all capacitors to which the power source voltage $V_L$ is applied, and a capacitor $C_{T12}$ indicates a composite capacitor of all capacitors to which the power source voltage $V_H$ is applied.

The writing selection signal 1 ($Sel_1$) of Hi(1) is inputted to the selection switch $SWb_1$ and it is turned on, the writing selection signal 2 ($Sel_2$) of Lo(0) is inputted to the $SWb_2$ and it is turned off, and the reset signal (Res) of Lo(0) is inputted to the SWa and it is turned off. As a result, the other electrode of each of the capacitors ($C, 2C, \ldots, 2^{n-1}C$) is connected to the source signal line, and an analog signal $V_{out1}$ by the upper bit information is inputted from the DAC to the source signal line.

Figure 4:
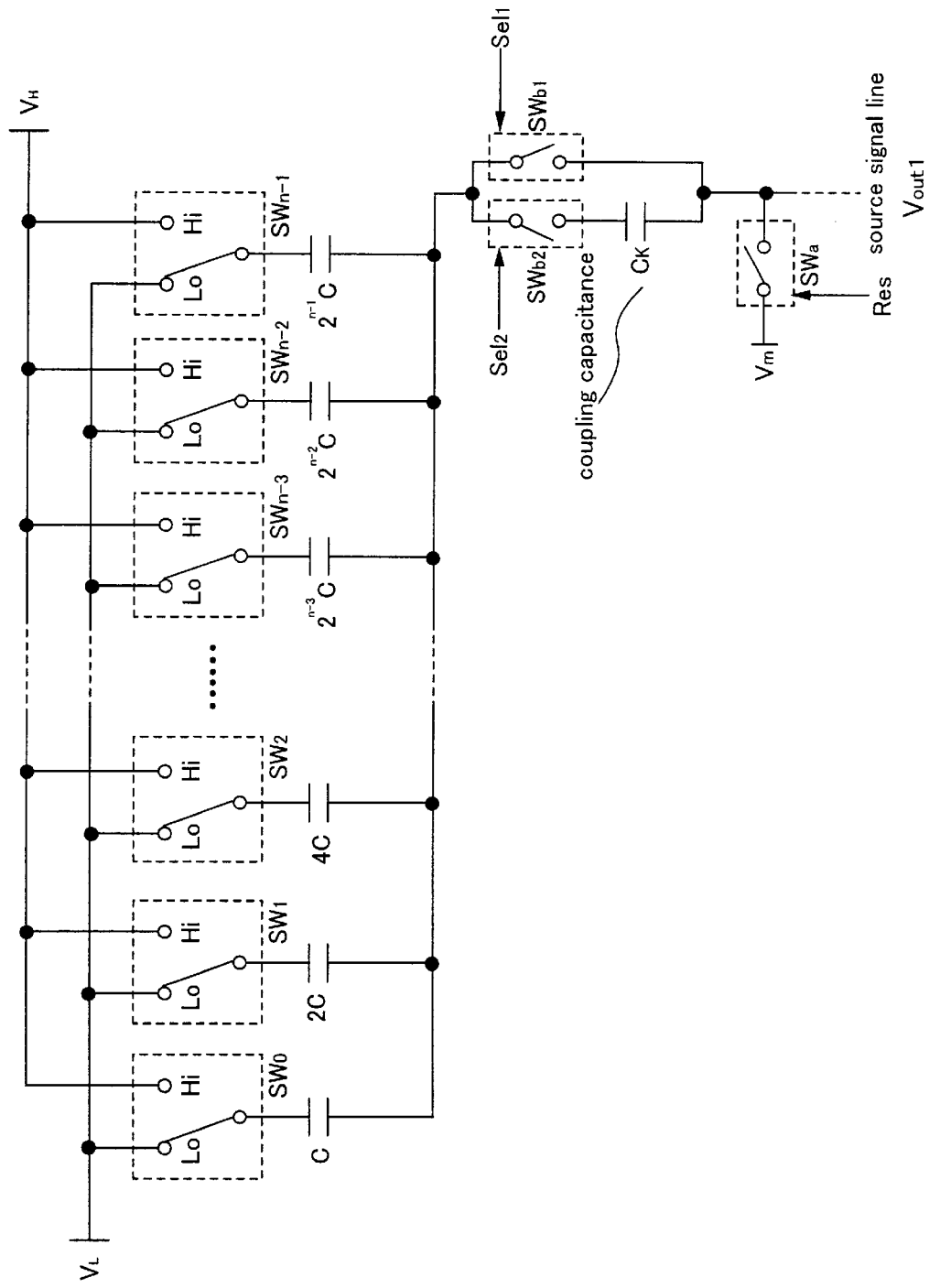
FIG. 4 is a circuit diagram of the DAC of the present invention.

FIG. 4 is a circuit diagram of the DAC of the present invention in the soft reset period. FIG. 6C is an equivalent circuit diagram of the DAC of the present invention shown in FIG. 4. After the completion of the upper bit writing period, in the soft reset period, the signal of 0 (Lo) is inputted to all the switches ($SW_0$ to $SW_{n-1}$). The one electrode of each of the capacitors (C, 2C, . . . , $2^{n-1}C$) is connected to the power source L by the n switches ($SW_0$ to $SW_{n-1}$), and the power source voltage $V_L$ is applied. In FIG. 6C, a capacitor $C_T$ indicates a composite capacitor of the capacitors (C, 2C, . . . , $2^{n-}C$) to which the power source voltage $V_L$ is applied.

The writing selection signal 1 ($Sel_1$) of Lo(0) is inputted to the selection switch $SWb_1$ and it is turned off, the writing selection signal 2 ($Sel_2$) of Lo(0) is inputted to the $SWb_2$ and it is turned off, and the reset signal (Res) of Lo(0) is inputted to the SWa and it is turned off. As a result, the other electrode of each of the capacitors (C, 2C, . . . , $2^{n-1}C$) becomes a state (floating) where it is not connected to any power sources, and the source signal line is kept the potential $V_{out1}$ of the analog signal by the upper bit information inputted from the DAC in Phase 1.

Figure 5:
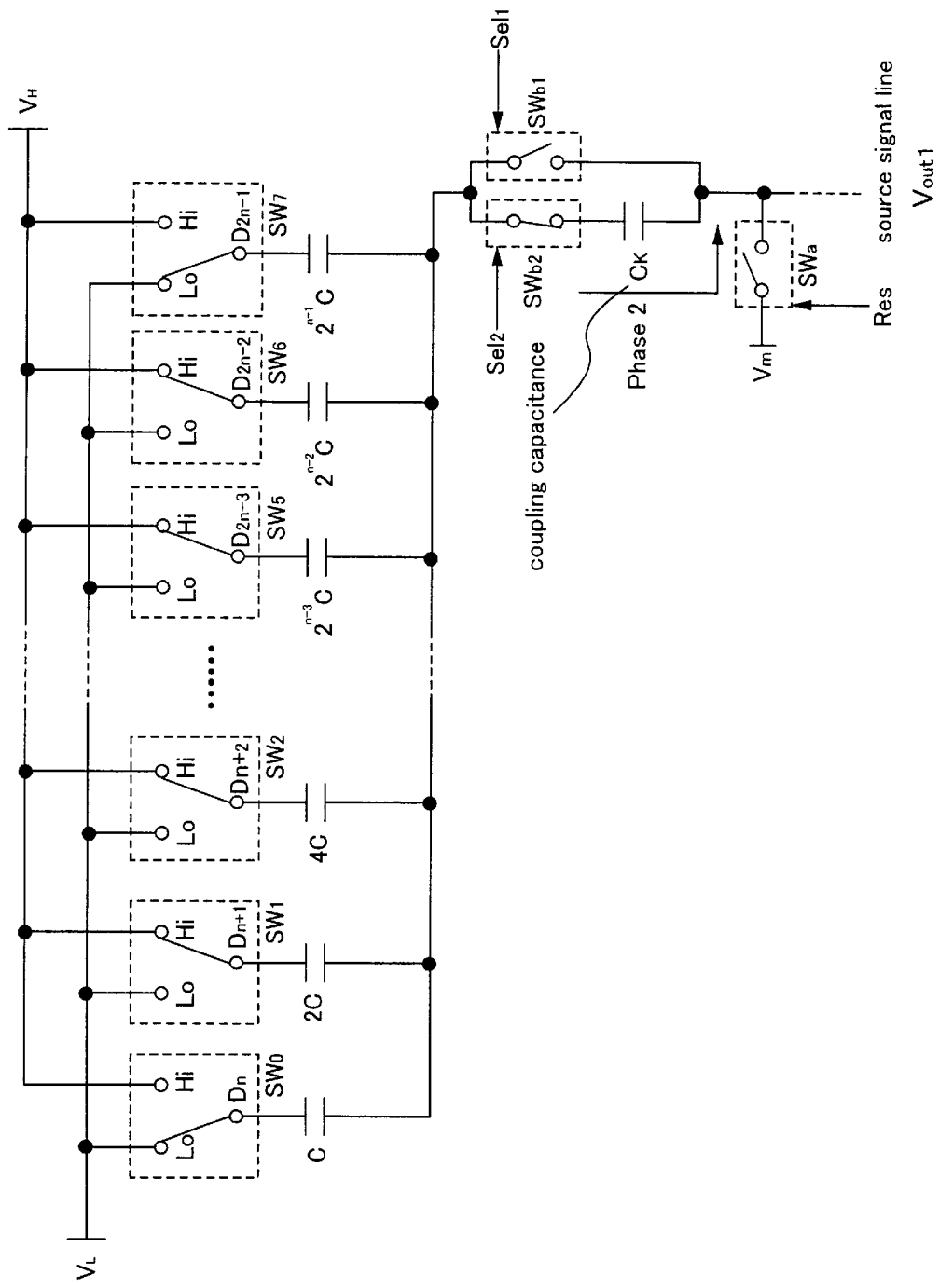
FIG. 5 is a circuit diagram of the DAC of the present invention.

FIG. 5 is a circuit diagram of the DAC of the present invention in the lower bit writing period (Phase 2) after the completion of the soft reset period. FIG. 6D is an equivalent circuit diagram of the DAC of the present invention shown in FIG. 5. After the completion of the soft reset period, in the lower bit writing period, each of the lower n bits ($D_0$ to $D_{n-1}$) of the digital signal has arbitrary bit information of 1 or 0. The lower n bits ($D_0$ to $D_{n-1}$) of the digital signal are respectively inputted to the n switches ($SW_0$ to $SW_{n-1}$). The n switches ($SW_0$ to $SW_{n-1}$) are then controlled, the one electrode of each of the capacitors (C, 2C, . . . , $2^{-1}C$) is connected to the power source L or the power source H, and the power source voltage $V_L$ or $V_H$ is applied. In FIG. 6D, a capacitor $C_{T21}$ indicates a composite capacitor of all capacitors to which the power source voltage $V_L$ is applied, and a capacitor $C_{T22}$ indicates a composite capacitor of all capacitors to which the power source voltage $V_H$ is applied.

The writing selection signal 1 ($Sel_1$) of Lo(0) is inputted to the selection switch $SWb_1$ and it is turned off, the writing selection signal 2 ($Sel_2$) of Hi(1) is inputted to the $SWb_2$ and it is turned on, and the reset signal (Res) of Lo(0) is inputted to the SWa and it is turned off. As a result, the other electrode of each of the capacitors (C, 2C, . . . , $2^{n-1}C$) is connected to one electrode of the coupling capacitor $C_k$. The other electrode of the coupling capacitor $C_k$ is connected to the source signal line, and an analog signal $V_{out2}$ by the lower bit information is outputted from the DAC to the source signal line.

A period until the completion of the lower bit writing period is made one analog signal output period. When the one analog signal output period is completed, the DAC again becomes in the reset period, and the foregoing operation is repeated.

Figure 7:
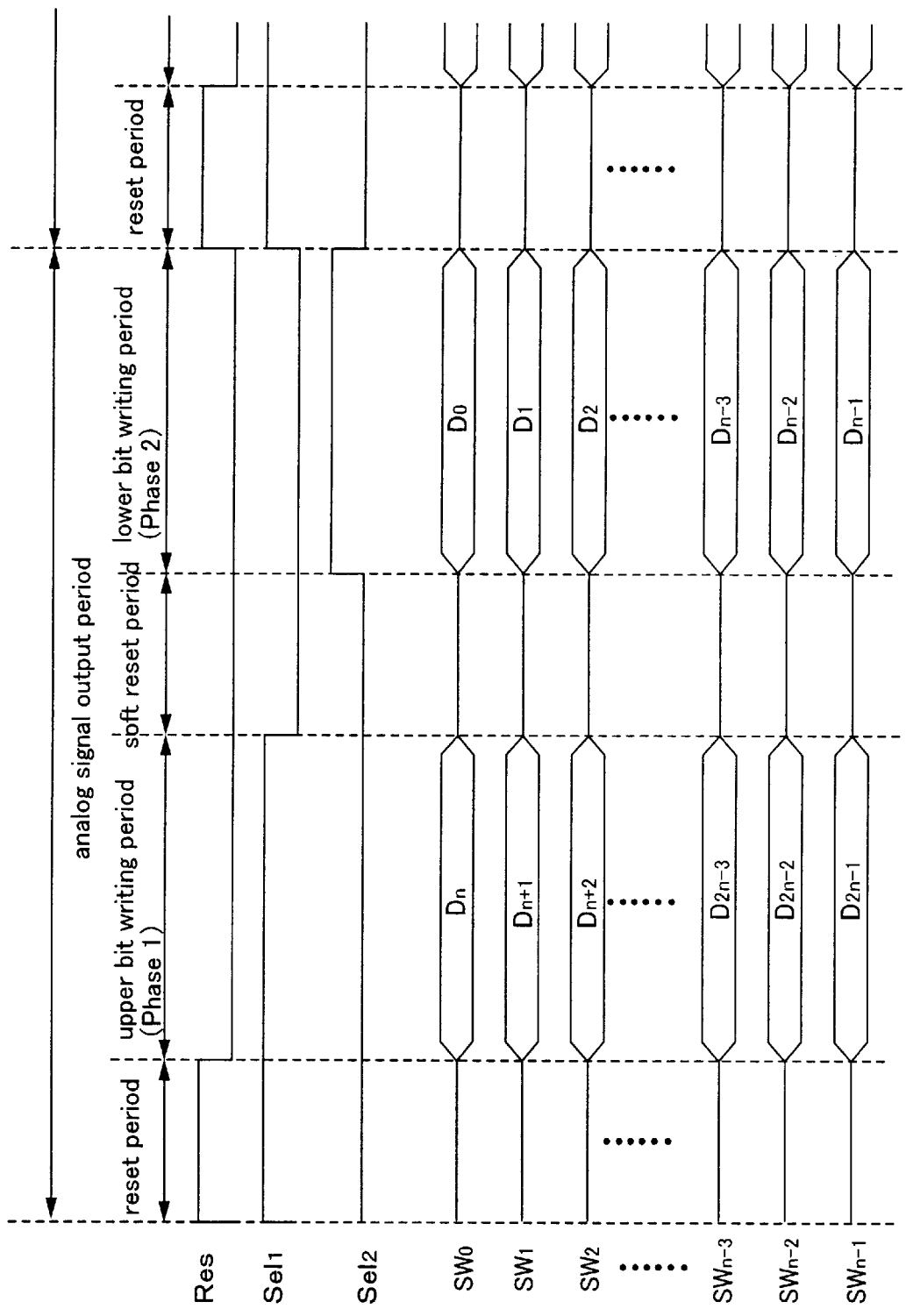
FIG. 7 is a timing chart of the DAC of the present invention.

FIG. 7 is a timing chart, in the above operation, of the digital signal ($D_1$ to $D_{2n-1}$) inputted to the n switches ($SW_0$ to $SW_{n-1}$), the reset signal (Res) inputted to the reset switch SWa, and the writing selection signal 1 ($Sel_1$) and the writing selection signal 2 ($Sel_2$) inputted to each of the selection switches $SWb_1$ and $SWb_2$.

In the reset period, the Res is Hi and the reset switch SWa is turned on. All of the $Sel_1$, $Sel_2$, $D_0$ to $D_{2n-1}$ are Lo, and all of the selection switches $SWb_1$ and $SWb_2$, and the n LS switches ($SW_0$ to $SW_{n-1}$) are turned off.

In the upper bit writing period, the Res and the $Sel_2$ are Lo, and the reset switch SWa and the selection switch $SWb_2$ are turned off. The $Sel_1$ is Hi, and the selection switch $SWb_1$ is turned on. The $D_0$ to $D_{2n-1}$ are respectively Lo or Hi, and the corresponding n switches ($SW_0$ to $SW_{n-1}$) are turned off or on.

In the soft reset period, all of the Res, $Sel_1$, $Sel_2$, $D_0$ to $D_{2n-1}$ are Lo, and all of the reset switch SWa, the selection switches $SWb_1$ and $SWb_2$, and the n switches ($SW_0$ to $SW_{n-1}$) are turned off.

In the lower bit writing period, the Res and the $Sel_1$ are Lo, and the reset switch SWa and the selection switch $SWb_1$ are turned off. The $Sel_2$ is Hi, and the selection switch $SWb_2$ is turned on. The $D_0$ to $D_{2n-1}$ are respectively Lo or Hi, and the corresponding n switches ($SW_0$ to $SW_{n-1}$) are turned off or on.

Incidentally, in the lower bit writing period, such a modification may be adopted that the digital signal ($D_0$ to $D_{2n-1}$) are inputted to the n switches ($SW_0$ to $SW_{n-1}$) after the selection switch $SWb_1$ is turned off and the selection switch $SWb_2$ is turned on, so that a noise generated at the time of charging the capacitors (C, 2C, . . . , $2^{n-1}$) is not transmitted to the source signal line.

Like this, after the analog signal by the upper bit information is written to the source signal line, the analog signal by the lower bit information is written, so that the analog signal by the upper bit information and the analog signal by the lower bit information are combined to form an analog signal to be inputted to the source signal line. Thus, the 2-bit digital signal can be converted into the analog signal.

In the present invention, the amplitude of the analog signal $V_{out}$ outputted from the DAC can be determined by the difference between the power source voltages $V_H$ and $V_L$, and if the difference between the power source voltages $V_H$ and $V_L$ is constant, even when both the power source voltages $V_H$ and $V_L$ are made low, the analog signal of the same potential $V_{out}$ can be obtained. Thus, the power source voltages can be made low.

Since the present invention has the foregoing structure, it has become possible to convert the 2n-bit digital signal into the analog signal by the DAC using the n capacitors and one coupling capacitor $C_k$. Thus, the size of the DAC can be made about half of the size of a conventional DAC. As a result, it becomes possible to lessen the area of the driving circuit, and it has become possible to make a liquid crystal panel included in an active matrix type liquid crystal display device thin and lightweight. Besides, even if the number of source signal lines is increased and the number of D/A conversion circuits is increased, since the area of the D/A conversion circuit can be made small in the present invention, it is possible to prevent the increase in the area of a driving circuit due to the higher precision as compared with the case using a conventional DAC.

Hereinafter, embodiments of the DAC of the present invention will be described. Incidentally, the concrete structure of the DAC of the present invention is not limited to the structures of the following embodiments.

EMBODIMENT 1

In this embodiment, a DAC for converting an 8-bit digital signal into an analog signal will be described.

Figure 8:
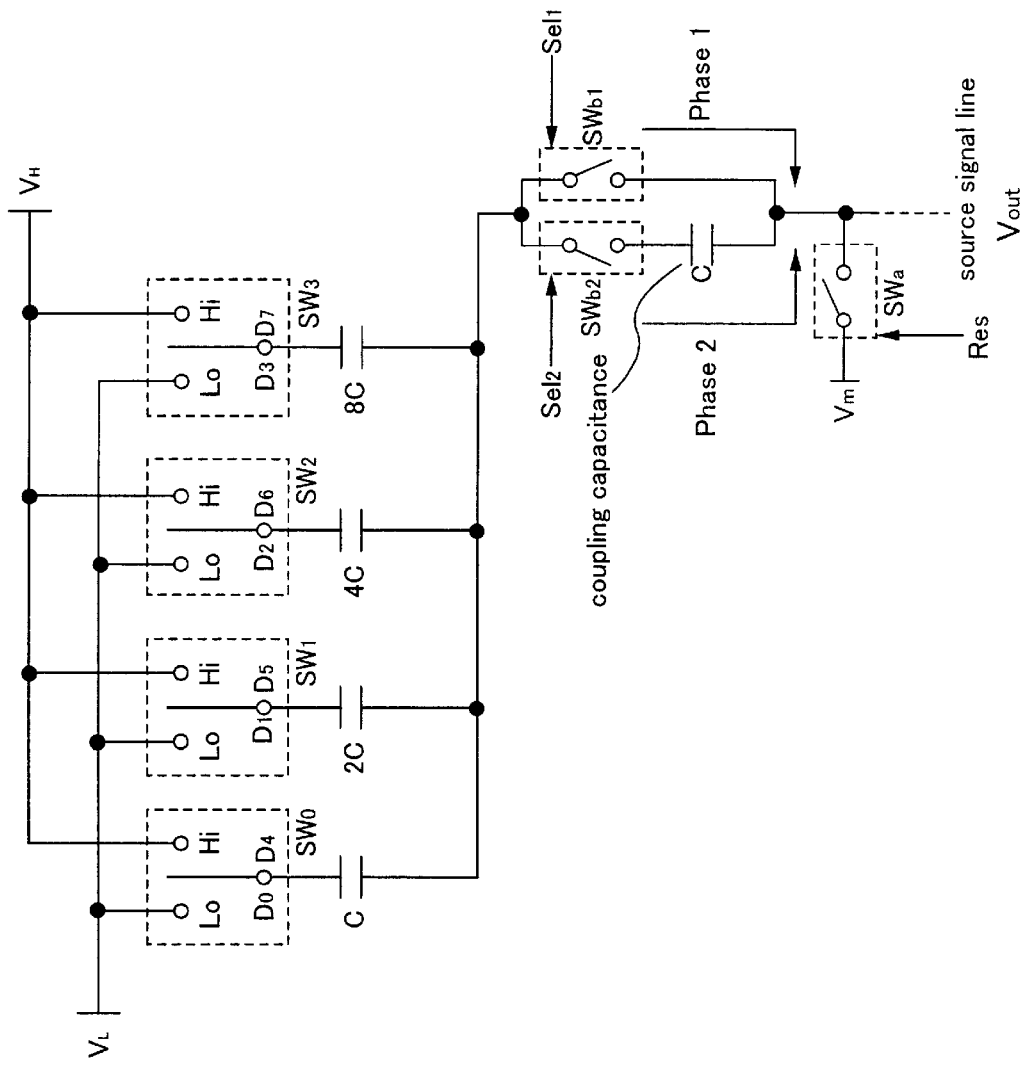
FIG. 8 is a circuit diagram of the DAC of the present invention.

FIG. 8 is a circuit diagram of a DAC of the present invention. The DAC of the present invention shown in FIG. 8 can process an 8-bit ($D_0$ to $D_7$) digital signal.

As shown in FIG. 8, the DAC of the present invention includes four switches ($SW_0$ to $SW_3$) controlled by each bit of the 8-bit digital signal ($D_0$ to $D_7$), capacitors (C, 2C, $2^2C$, $2^3$C) connected to the respective switches (SW$_0$ to SW$_3$), a reset switch SWa, selection switches SWb$_1$ and SWb$_2$, and a coupling capacitor C$_k$ (capacitance value C). Incidentally, C indicates unit capacitance and is a constant.

When the inputted digital signal (D$_0$ to D$_7$) is 0 (Lo), the switches (SW$_0$ to SW$_3$) respectively connects a power source V$_L$ and the capacitors (C, 2C, $2^2$C, $2^3$C), and when the digital signal (D$_0$ to D$_7$) is 1 (Hi), they connect a power source V$_H$ and the capacitors (C, 2C, $2^2$C, $2^3$C). For convenience of explanation, it is defined that the value of the digital signal is 1 when it is Hi, and the value of the digital signal is 0 when it is Lo.

By a reset signal (Res) inputted to the reset switch SWa, charging of electric charges from a power source M to the capacitors (C, 2C, $2^2$C, $2^3$C) is controlled.

By writing selection signals 1 and 2 (Sel$_1$ and Sel$_2$) respectively inputted to the selection switches SWb$_1$ and SWb$_2$, it is selected whether the capacitors (C, 2C, $2^2$C, $2^3$C) are directly connected to a source signal line, or whether the coupling capacitor C$_k$ is connected in series between the capacitors and the source signal line.

The writing selection signal 1 (Sel$_1$) is inputted to the SWb$_1$, and the writing selection signal 2 (Sel$_2$) is inputted to the SWb$_2$. The reset signal (Res) is inputted to the SWa. When the selection signal 1 (Sel$_1$), the selection signal 2 (Sel$_2$), and the reset signal (Res) are respectively Hi(1), the SWb$_1$, the SWb$_2$, and the SWa are respectively turned on. On the contrary, when the selection signal 1 (Sel$_1$), the selection signal 2 (Sel$_2$), and the reset signal (Res) are respectively Lo(0), the SWb$_1$, the SWb$_2$, and the SWa are respectively turned off.

In the digital signal, D$_0$ is made the LSB (Least Significant Bit) and D$_7$ is made the MSB (Most Significant Bit). In the present specification, an 8-bit digital signal is divided into upper 4 bits (D$_0$ to D$_3$) and lower 4 bits (D$_4$ to D$_7$). The value of the digital signal (D$_0$ to D$_7$) is either one of Hi and Lo.

The DAC of the present invention is connected with the power source H, the power source L, and the reset power source M. In this specification, it is defined that the power source voltage of the power source H is V$_H$, the power source voltage of the power source L is V$_L$, and the power source voltage of the reset power source M is V$_M$. Incidentally, the phase of an analog signal outputted from the DAC in the case of V$_H$>V$_L$ is opposite to that in the case of V$_H$<V$_L$. Here, the phase of the output in the case of V$_H$>V$_L$ is made a positive phase, and the phase of the output in the case of V$_H$<V$_L$ is made an inversion phase.

The operation of the DAC of the present invention comprises a reset period for resetting electric charges held by the capacitors, an upper bit writing period (Phase 1) for inputting the upper 4-bit digital signal to the switches, a soft reset period for causing the potential of one electrode of each of the capacitors connected to the power source H or the power source L in the Phase 1 to be the power source potential V$_L$, and a lower bit writing period (Phase 2) for inputting the lower 4-bit digital signal to the switches.

In the reset period, the signal of 0 (Lo) is inputted to all the switches (SW$_0$ to SW$_3$). As a result, by the four switches (SW$_0$ to SW$_3$), one electrode of each of the capacitors (C, 2C, $2^2$C, $2^3$C) is connected to the power source L, and the power source voltage V$_L$ is applied.

The writing selection signal 1 (Sel$_1$) of Hi(1) is inputted to the selection switch SWb$_1$ and it is turned on, the writing is turned off, and the reset signal (Res) of Hi(1) is inputted to the SWa and it is turned on. As a result, the other electrode of each of the capacitors (C, 2C, $2^2$C, $2^3$C) is connected to the power source M and the power source voltage V$_M$ is applied.

After the completion of the reset period, in the upper bit writing period (Phase 1), the upper four bits (D$_4$ to D$_7$) of the digital signal respectively have arbitrary bit information of 1 or 0. The upper four bits (D$_4$ to D$_7$) of the digital signal are respectively inputted to the four switches (SW$_0$ to SW$_3$). As a result, the one electrode of each of the capacitors (C, 2C, $2^2$C, $2^3$C) is connected to the power source L or the Power source H by the four switches (SW$_0$ to SW$_3$), and the power source voltage V$_L$ or V$_H$ is applied.

The writing selection signal 1 (Sel$_1$) of Hi(1) is inputted to the selection switch SWb$_1$ and it is turned on, the writing selection signal 2 (Sel$_2$) of Lo(0) is inputted to the SWb$_2$ and it is turned off, and the reset signal (Res) of Lo(0) is inputted to the SWa and it is turned off. As a result, the other electrode of each of the capacitors (C, 2C, $2^2$C, $2^3$C) is connected to the source signal line, and an analog signal V$_{out}$ by the upper bit information is inputted from the DAC to the source signal line.

After the completion of the upper bit writing period, in the soft reset period, the signal of 0 (Lo) is inputted to all the switches (SW$_0$ to SW$_3$). Then, the other electrode of each of the capacitors (C, 2C, $2^2$C, $2^3$C) is connected to the power source L by the four switches (SW$_0$ to SW$_3$), and the power source voltage V$_L$ is applied.

The writing selection signal 1 (Sel$_1$) of Lo(0) is inputted to the selection switch SWb$_1$ and it is turned off, the writing selection signal 2 (Sel$_2$) of Lo(0) is inputted to the SWb$_2$ and it is turned off, and the reset signal (Res) of Lo(0) is inputted to the SWa and it is turned off. As a result, the other electrode of each of the capacitors (C, 2C, $2^2$C, $2^3$C) becomes in a state where it is not connected to any power sources (floating), and the source signal line is kept the potential V$_{out1}$ of the analog signal by the upper bit information inputted from the DAC in Phase 1.

After the completion of the soft reset period, in the lower bit writing period, the lower four bits (D$_0$ to D$_3$) of the digital signal have respectively arbitrary bit information of 1 or 0. The lower four bits (D$_0$ to D$_3$) of the digital signal are respectively inputted to the four switches (SW$_0$ to SW$_3$). The four switches (SW$_0$ to SW$_3$) are then controlled, the one electrode of each of the capacitors (C, 2C, $2^2$C, $2^3$C) is connected to the power source L or the power source H respectively, and the power source voltage V$_L$ or V$_H$ is applied.

The writing selection signal 1 (Sel$_1$) of Lo(0) is inputted to the selection switch SWb$_1$ and it is turned off, the writing selection signal 2 (Sel$_2$) of Hi(1) is inputted to the SWb$_2$ and it is turned on, and the reset signal (Res) of Lo(0) is inputted to the SWa and it is turned off. As a result, the other electrode of each of the capacitors (C, 2C, $2^2$C, $2^3$C) is connected to one electrode of the coupling capacitor C$_k$. The other electrode of the coupling capacitor C$_k$ is connected to the source signal line, and an analog signal V$_{out2}$ by the lower bit information is outputted from the DAC to the source signal line.

After the completion of the lower bit writing period, the DAC becomes again in the reset period and repeats the foregoing operation.

Like this, after the analog signal by the upper bit information is written to the source signal line, the analog signal by the lower bit information is further written, so that the analog signal by the upper bit information is combined with the analog signal by the lower bit information to form an analog signal and it can be inputted to the source signal line. Thus, the 8-bit digital signal can be converted into the analog signal.

In the present invention, the amplitude of the analog signal $V_{out}$ outputted from the DAC can be determined by the difference between the power source voltages $V_H$ and $V_L$, and if the difference between the power source voltages $V_H$ and $V_L$ is constant, even if both the power source voltages $V_H$ and $V_L$ are made low, the analog signal of the same potential $V_{out}$ can be obtained. Thus, the power source voltage can be made low.

Since the present invention has the foregoing structure, it has become possible to convert the 8-bit digital signal into the analog signal by the DAC using the four capacitors and the one coupling capacitor $C_k$. Thus, the size of the DAC can be made about half of the size of a conventional DAC. As a result, it becomes possible to lessen the area of the driving circuit, and it has become possible to make a liquid crystal panel included in an active matrix type liquid crystal display device thin and lightweight. Besides, even when the number of source signal lines is increased and the number of D/A conversion circuits is increased, since the area of the D/A conversion circuit can be lessened according to the present invention, it is possible to prevent the increase in the area of a driving circuit due to the high precision as compared with the case using a conventional DAC.

EMBODIMENT 2

Figure 9:
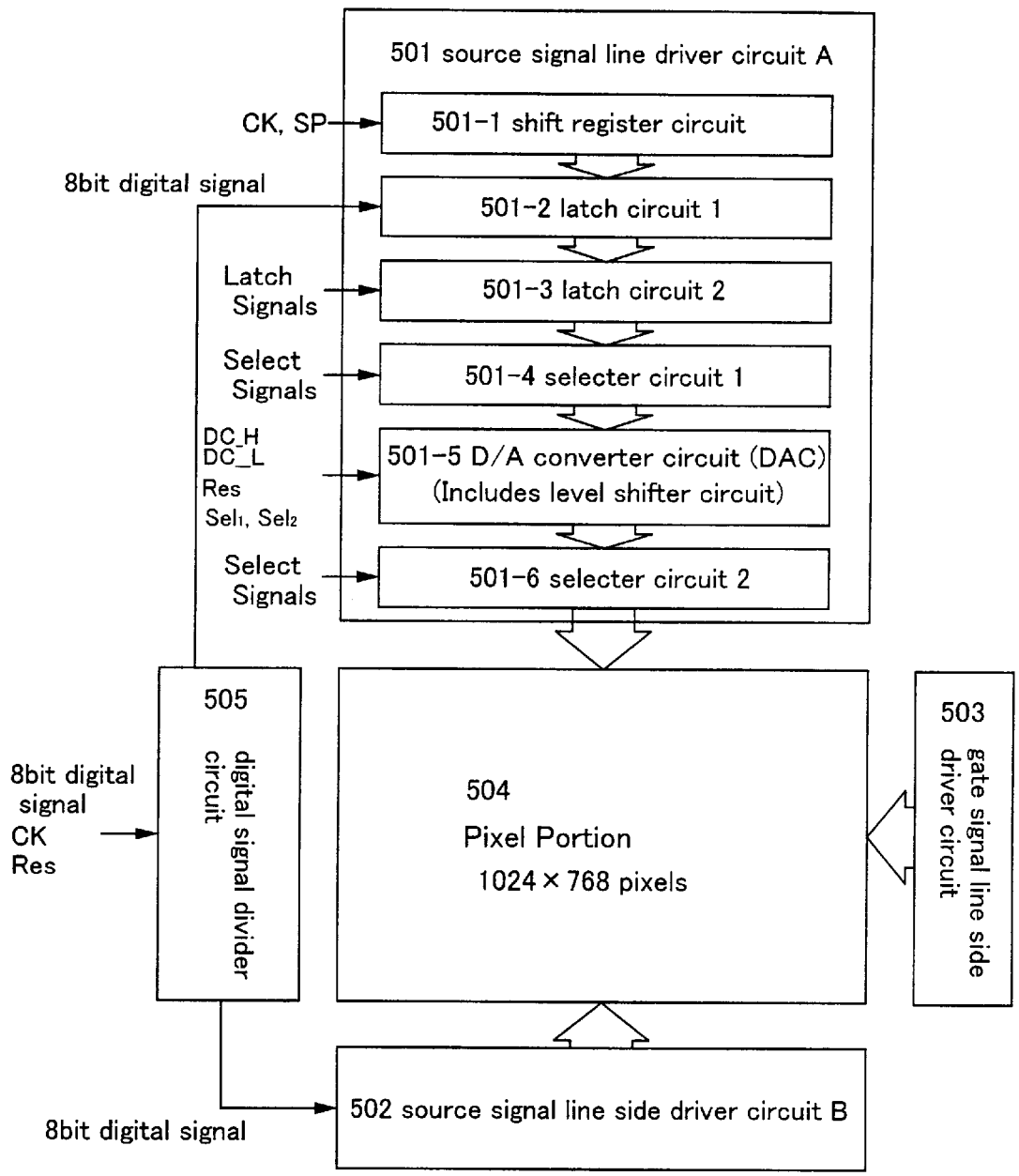
FIG. 9 is a schematic block diagram of an active matrix type liquid crystal display device using a DAC of the present invention.

FIG. 9 is a schematic block diagram of an active matrix type liquid crystal display device of this embodiment. Reference numeral 501 designates a source signal line driving circuit A; 502, a source signal line driving circuit B; 503, a gate signal line driving circuit; 504, a pixel portion; and 505, a digital signal dividing circuit (SPC; Serial-to-Parallel Conversion Circuit).

The source signal line driving circuit A 501 comprises a shift register circuit (shift register circuit of 128 stages×2) 501-1, a latch circuit 1 (512×8 digital latch circuits) 501-2, a latch circuit 2 (512×8 digital latch circuits) 501-3, a selector circuit 1 (128 selector circuits) 501-4, a D/A conversion circuit (128 DACs) 501-5, and a selector circuit 2 (128 selector circuits) 501-6. In addition, a buffer circuit and a level shifter circuit (neither shown) are included. For convenience of explanation, the DAC 501-5 comprises a level shifter circuit.

The source signal line driving circuit B 502 has the same structure as the source signal line circuit A 501. The source signal line side driving circuit A 501 supplies a picture signal (gray scale voltage signal) to an odd source signal line, and the source signal line side driving circuit B 502 supplies a picture signal to an even source signal line.

Incidentally, in the active matrix type liquid crystal display device of this embodiment, for convenience of circuit layout, the source signal line driving circuit A and the source signal line driving circuit B are provided at the upper and lower sides of the pixel portion. However, if possible in circuit layout, only one source signal line driving circuit may be provided.

Reference numeral 503 designates the gate signal line driving circuit, which comprises a shift register circuit, a buffer circuit, a level shifter circuit, and the like (none of the circuits are shown).

The pixel portion 504 includes 1024×768 (horizontal× vertical) pixels. A pixel TFT is disposed in each pixel, a source signal line is electrically connected to a source region of each pixel TFT, and a gate signal line is electrically connected to a gate electrode. A pixel electrode is electrically connected to a drain region of each pixel TFT. Each pixel TFT controls supply of a picture signal (analog signal) to the pixel electrode electrically connected to each pixel TFT. The picture signal (analog signal) is supplied to each pixel electrode, a voltage is applied to a liquid crystal held between the respective pixel electrode and an opposite electrode, and the liquid crystal is driven.

Here, the operation of the active matrix type liquid crystal display device of this embodiment and the flow of signals will be described.

First, the operation of the source signal line side driving circuit A 501 will be described. A clock signal (CK) and a start pulse (SP) are inputted to the shift register circuit 501-1. The shift register circuit 501-1 sequentially generates a timing signal on the basis of the clock signal (CK) and the start pulse (SP), and sequentially supplies the timing signal to a later stage circuit through a buffer circuit or the like (not shown).

The timing signal from the shift register circuit 501-1 is buffered by a buffer circuit or the like. Since many circuits or elements are connected to the source signal line to which the timing signal is supplied, the load capacitance (parasitic capacitance) is large. In order to prevent "dullness" of rising or falling of the timing signal which is caused by the largeness of the load capacitance, this buffer circuit is provided.

The timing signal buffered by the buffer circuit is supplied to the latch circuit 1 (501-2). The latch circuit 1 (501-2) includes 512 stages of latch circuits for processing an 8-bit digital signal. When the timing signal is inputted, the latch circuit 1 (501-2) sequentially takes in the 8-bit digital signal supplied from the digital signal dividing circuit and holds it.

A time when writing of digital signals to the latch circuits of all stages of the latch circuit 1 (501-2) is roughly completed, is called a line period. That is, the line period is a time interval between the point when writing of the digital signal is started for the latch circuit of the leftmost stage in the latch circuit 1 (501-2) and the point when writing of the digital signal to the latch circuit of the rightmost stage is completed. Actually, a period in which a horizontal retrace period is added to the above line period is also sometimes referred to as the line period.

After the completion of one line period, a latch signal is supplied to the latch circuit 2 (501-3) in synchronization with the operation timing of the shift register circuit 501-1. At this instant, the digital signals written in and held by the latch circuit 1 (501-2) are sent to the latch circuit 2 (501-3) at the same time, and are written in the latch circuits of all stages of the latch circuit 2 (501-3) and are held.

In the latch circuit 1 (501-2) in which the digital signals have been transmitted to the latch circuit 2 (501-3), on the basis of the timing signal from the shift register circuit 501-1, again writing of the digital signal supplied from the digital signal dividing circuit is sequentially performed.

In this second one line period, the digital signals written in and held by the latch circuit 2 (501-3) are sequentially selected by the selector circuit 1 (501-4), and are supplied to the D/A conversion circuit (DAC) 501-5. Incidentally, in this embodiment, in the selector circuit 1 (501-4), one selector circuit corresponds to four source signal lines.

Incidentally, in this embodiment, as the selector circuit, what is disclosed in Japanese Patent Application No. Hei. 9-286098 by the present applicant may be used.

In the selector circuit 501-4 of this embodiment, one selector circuit is provided every four source signal lines. An 8-bit digital signal supplied from the latch circuit 2 (501-3) is selected by the corresponding source signal line for every ¼ of one line scanning period.

The 8-bit digital signal selected by the selector circuit 501-4 is supplied to the DAC 501-5. Here, as the DAC of the present invention used for this embodiment, the DAC disclosed in embodiment 1 can be used.

The DAC 501-5 converts the 8-bit digital signal into an analog signal (gray scale voltage) and sequentially supplies it to the source signal line selected by the selector circuit 2 (501-6). The operation of the DAC in this embodiment is in accordance with the operation of the foregoing embodiment 1.

The analog signal supplied to the source signal line is supplied to the source region of the pixel TFT of the pixel portion connected to the source signal line.

Reference numeral 502 designates the source signal line driving circuit B, and the structure is the same as the source signal line driving circuit A 501. The source signal line driving circuit B 502 supplies an analog signal to an even source signal line.

In the gate signal line driving circuit 503, the timing signal from the shift register (not shown) is supplied to the buffer circuit (not shown), and is supplied to the corresponding gate signal line (scanning line). Gate electrodes of pixel TFTs for one line are connected to the gate signal line, and all the pixel TFTs for one line must be turned ON at the same time, so that a large current capacity buffer circuit is used.

Like this, switching of the corresponding pixel TFT is performed by the scanning signal from the gate signal line driving circuit, and the analog signal (gradation voltage) from the source signal line driving circuit is supplied to the pixel TFT, so that liquid crystal molecules are driven.

Reference numeral 505 designates the digital signal dividing circuit (SPC; Serial-to-Parallel Conversion Circuit). The digital signal dividing circuit 110 is a circuit for decreasing the frequency of a digital signal inputted from the outside to 1/m. By dividing the digital signal inputted from the outside, the frequency of a signal necessary for the operation of the driving circuit can also be decreased to 1/m.

In this embodiment, an 8-bit digital signal of 80 MHz is inputted to the digital signal dividing circuit 505 from the outside. The digital signal dividing circuit 505 serial-parallel converts the 8-bit digital signal of 80 MHz inputted from the outside, and supplies the digital signal of 10 MHz to the source signal line driving circuit.

Incidentally, in the digital signal dividing circuit 505 of this embodiment, in addition to the digital signal of 80 MHz, the clock (CK) of 40 MHz and the reset pulse Res are inputted from the outside. The digital signal dividing circuit 505 of this embodiment needs a clock signal of only half frequency of the frequency of the inputted digital signal. Thus, as compared with a conventional one, the digital signal dividing circuit 505 of this embodiment is high in stability and reliability.

EMBODIMENT 3

Here, the method of manufacturing on one and the same substrate pixel TFTs for the pixel section and TFTs of driving circuits (a source signal line driver circuit, a gate signal line driver circuit, a D/A conversion circuit, digital signal time ratio gray scale processing circuit and the like) provided in the periphery of the pixel section will be described in detail in accordance with the fabricating steps. However, in order to simplify the description, CMOS circuits that are the basic circuits of a shift register circuit, a buffer circuit, a D/A conversion circuit and the like and n-channel type TFTs will be shown.

Figure 10A:
FIGS. 10A to 10D are sectional views showing a manufacturing process of a TFT.

Referring to FIG. 10A, a low-alkaline glass substrate or a quartz substrate can be used as a substrate 6001. SOI substrates such as a Smart-Cut, SIMOX, ELTRAN, etc., may also be used in the present invention. In this embodiment, a low-alkaline glass substrate was used. In this case, a heat treatment at a temperature lower by about 10 to 20° C. than the strain point of glass may be performed in advance. On the surface of this substrate 6001 on which TFTs are to be formed, a base film 6002 such as a silicon oxide film, a silicon nitride film or a silicon oxynitride film is formed in order to prevent the diffusion of impurities from the substrate 6001. For example, a silicon oxynitride film which is fabricated from $SiH_4$, $NH_3$, $N_2O$ by, e.g., by plasma CVD into 100 nm and a silicon oxynitride film which is similarly fabricated from $SiH_4$ and $N_2O$ into 200 nm are formed into a laminate.

Next, a semiconductor film 6003a that has an amorphous structure and a thickness of 20 to 150 nm (preferably, 30 to 80 nm) is formed by a known method such as plasma CVD or sputtering. In this embodiment, an amorphous silicon film was formed to a thickness of 55 nm by plasma CVD. As semiconductor films which have an amorphous structure, there are an amorphous semiconductor film and a microcrystalline semiconductor film; and a compound semiconductor film with an amorphous structure such as an amorphous silicon germanium film may also be applied. Further, the base film 6002 and the amorphous silicon film 6003a can be formed by the same deposition method, so that the two films can be formed in succession. By not exposing the base film to the atmospheric air after the formation of the base film, the surface of the base film can be prevented from being contaminated, as a result of which the dispersion in characteristics of the fabricated TFTs and the variation in the threshold voltage thereof can be reduced. (FIG. 10A)

Figure 10B:
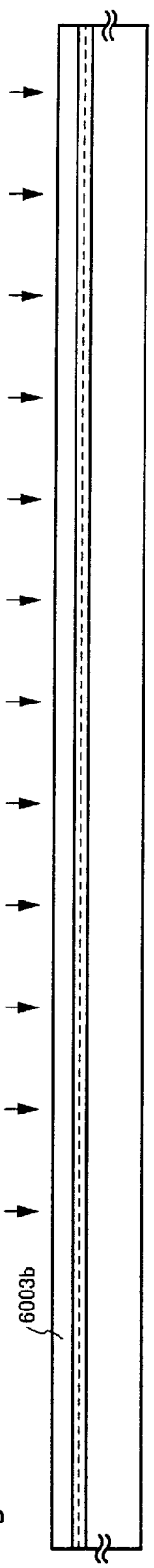

Then, by a known crystallization technique, a crystalline silicon film 6003b is formed from the amorphous silicon film 6003a. For example, a laser crystallization method or a thermal crystallization method (solid phase growth method) may be applied. A continuous light emitting excimer laser may be used in laser crystallization. Here, in accordance with the technique disclosed in Japanese Patent Application Laid-Open No. Hei 7-25130652, the crystalline silicon film 6003b was formed by the crystallization method using a catalytic element. It is preferred that, prior to the crystallization step, heat treatment is carried out at 400 to 500° C. for about one hour though it depends on the amount of hydrogen contained, so that, after the amount of hydrogen contained is reduced to 5 atomic % or less, the crystallization is carried out. The atoms are subjected to re-configuration to become dense when an amorphous silicon film is crystallized; and therefore, the thickness of the crystalline silicon film fabricated is reduced by about 1 to 15% than the initial thickness of the amorphous silicon film (55 nm in this embodiment). (FIG. 10B)

Figure 10C:
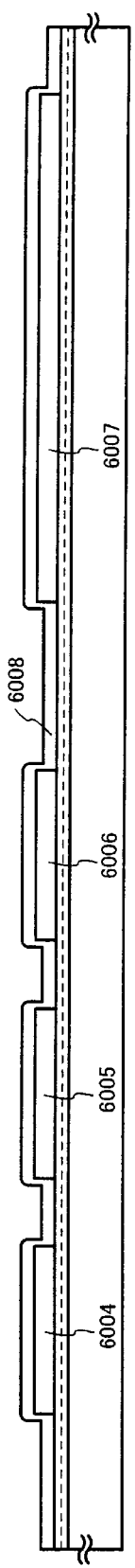

Then, the crystalline silicon film 6003b is divided into island-shaped portions, whereby island semiconductor layers 6004 to 6007 are formed. Thereafter, a mask layer 6008 of a silicon oxide film is formed to a thickness of 50 to 100 nm by plasma CVD or sputtering. (FIG. 10C)

Then, a resist mask 6009 is provided, and, into the whole surfaces of the island semiconductor layers 6005 to 6007 forming the n-channel TFTs, boron (B) was added as an impurity element imparting p-type conductivity, at a concentration of about $1\times10^{16}$ to $5\times10^{17}$ atoms/cm$^3$, for the purpose of controlling the threshold voltage. The addition of boron (B) may be effected either by the ion doping or it may be added simultaneously when the amorphous silicon film is formed. The addition of boron (B) here was not always necessary, however, the formation of semiconductor layers 6010 to 6012 into which boron was added was preferable for maintaining the threshold voltage of the n-channel type TFTs within a prescribed range. (FIG. 10D)

In order to form the LDD regions of the n-channel TFTs in the driving circuit, an impurity element imparting n-type conductivity is selectively added to the island semiconductor layers 6010 and 6011. For this purpose, resist masks 6013 to 6016 were formed in advance. As the impurity element imparting the n-type conductivity, phosphorus (P) or arsenic (As) may be used; here, in order to add phosphorus (P), ion doping using phosphine (PH$_3$) was applied. The concentration of phosphorus (P) in the impurity regions 6017 and 6018 thus formed may be set within the range of from $2\times10^{16}$ to $5\times10^{19}$ atoms/cm$^3$. In this specification, the concentration of the impurity element contained in the thus formed impurity regions 6017 to 6019 imparting n-type conductivity is represented by (n). Further, the impurity region 6019 is a semiconductor layer for forming the storage capacitor of the pixel matrix circuit; into this region, phosphorus (P) was also added at the same concentration. (FIG. 11A)

Figure 10D:
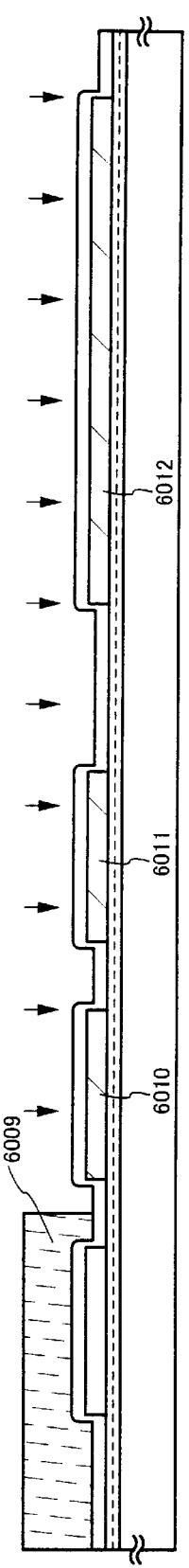
Figure 11A:
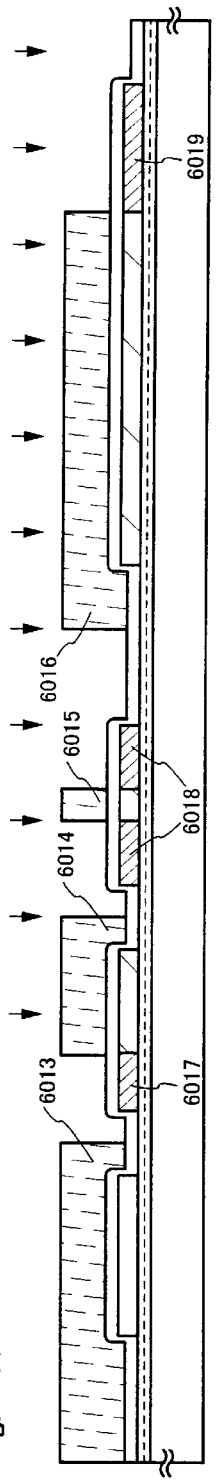
FIGS. 11A to 11D are sectional views showing the manufacturing process of the TFT.

Next, the mask layer 6008 is removed by hydrofluoric acid or the like, and the step of activating the impurity elements added at the steps shown in FIG. 10D and FIG. 11A is carried out. The activation can be carried out by performing heat treatment in a nitrogen atmosphere at 500 to 600° C. for 1 to 4 hours or by using the laser activation method. Further, both methods may be jointly performed. In this embodiment, the laser activation method was employed, and a KrF excimer laser beam (with a wavelength of 248 nm) was used to form a linear beam; and scan was carried out under the condition that the oscillation frequency was 5 to 50 Hz, the energy density was 100 to 500 mJ/cm$^2$, and the overlap ratio of the linear beam was 80 to 98%, whereby the whole substrate surface on which the island semiconductor layers were formed was treated. Any item of the laser irradiation condition is subjected to no limitation, so that the operator may suitably select the condition. Further, activation may be performed by using a continuous light emitting excimer laser.

Figure 11B:
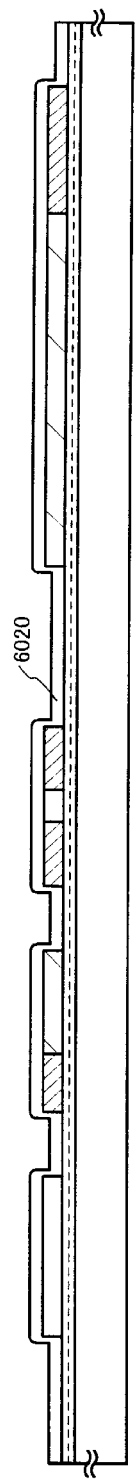

Then, a gate insulator film 6020 is formed of an insulator film comprising silicon to a thickness of 10 to 150 nm, by plasma CVD or sputtering. For example, a silicon oxynitride film is formed to a thickness of 120 nm. As the gate insulator film, another insulator film comprising silicon may be used as a single layer or a laminate structure. (FIG. 11B)

Next, in order to form a gate electrode, a first conductive layer is deposited. This first conductive layer may be comprised of a single layer but may also be comprised of a laminate consisting of two or three layers if necessary. In this embodiment, a conductive layer (A) 6021 comprising a conductive metal nitride film and a conductive layer (B) 6022 comprising a metal film are laminated. The conductive layer (B) 6022 may be formed of an element selected from among tantalum (Ta), titanium (Ti), molybdenum (Mo) and tungsten (W) or an alloy comprised mainly of the above-mentioned element, or an alloy film (typically, an Mo—W alloy film or an Mo—Ta alloy film) comprised of a combination of the above-mentioned elements, while the conductive layer (A) 6021 is formed of a tantalum nitride (TaN) film, a tungsten nitride (WN) film, a titanium nitride (TiN) film, or a molybdenum nitride (MoN) film. Further, as the substitute materials of the conductive film (A) 6021, tungsten silicide, titanium silicide, and molybdenum silicide may also be applied. The conductive layer (B) may preferably have its impurity concentration reduced in order to decrease the resistance thereof; in particular, as for the oxygen concentration, the concentration may be set to 30 ppm or less. For example, tungsten (W) could result in realizing a resistivity of 20 $\mu\Omega$cm or less by rendering the oxygen concentration thereof to 30 ppm or less.

Figure 11C:
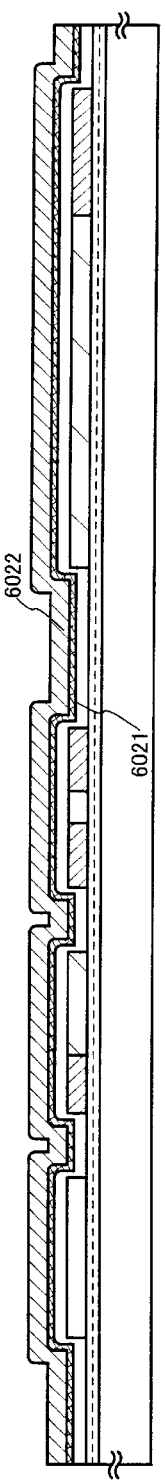

The conductive layer (A) 6021 may be set to 10 to 50 nm (preferably, 20 to 30 nm), and the conductive layer (B) 6022 may be set to 200 to 400 nm (preferably, 250 to 350 nm). In this embodiment, as the conductive layer (A) 6021, a tantalum nitride film with a thickness of 30 nm was used, while, as the conductive layer (B) 6022, a Ta film with a thickness of 350 nm was used, both films being formed by sputtering. In case of performing sputtering here, if a suitable amount of Xe or Kr is added into the sputtering gas Ar, the internal stress of the film formed is alleviated, whereby the film can be prevented from peeling off. Though not shown, it is effective to form a silicon film, into which phosphorus (P) is doped, to a thickness of about 2 to 20 nm underneath the conductive layer (A) 6021. By doing so, the adhesiveness of the conductive film formed thereon can be enhanced, and at the same time, oxidation can be prevented. In addition, the alkali metal element slightly contained in the conductive film (A) or the conductive film (B) can be prevented from diffusing into the gate insulator film 6020. (FIG. 11C)

Figure 11D:
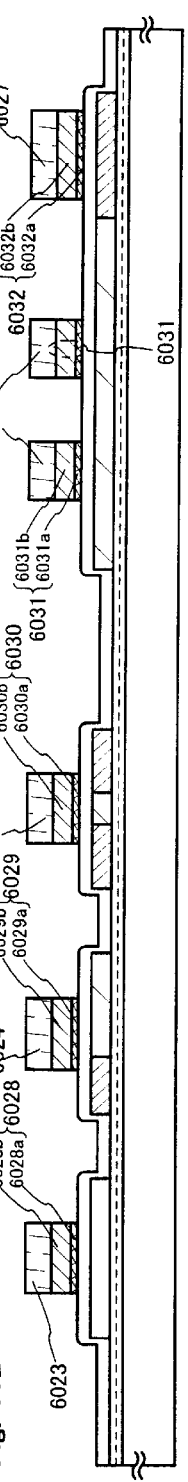

Next, resist masks 6023 to 6027 are formed, and the conductive layer (A) 6021 and the conductive layer (B) 6022 are etched together to form gate electrodes 6028 to 6031 and a capacitor wiring 6032. The gate electrodes 6028 to 6031 and the capacitor wiring 6032 are formed in such a manner that the layers 6028a to 6032a comprised of the conductive layer (A) and the layers 6028b to 6032b comprised of the conductive layer (B) are formed as one body respectively. In this case, the gate electrodes 6029 and 6030 formed in the driving circuit are formed so as to overlap the portions of the impurity regions 6017 and 6018 through the gate insulator film 6020. (FIG. 11D)

Then, in order to form the source region and the drain region of the p-channel type TFT in the driving circuit, the step of adding an impurity element imparting p-type conductivity is carried out. Here, by using the gate electrode 6028 as a mask, impurity regions are formed in a self-alignment manner. In this case, the region in which the n-channel type TFT will be formed is coated with a resist mask 6033 in advance. Thus, impurity regions 6034 were formed by ion doping using diborane (B$_2$H$_6$). The concentration of boron (B) in this region is brought to $3\times10^{20}$ to $3\times10^{21}$ atoms/cm$^3$. In this specification, the concentration of the impurity element imparting p-type contained in the impurity regions 6034 is represented by (p$^+$). (FIG. 12A)

Next, in the n-channel type TFTs, impurity regions that functioned as source regions or drain regions were formed. Resist masks 6035 to 6037 were formed, an impurity element for imparting the n-type conductivity was added to form impurity regions 6038 to 6042. This was carried out by ion doping using phosphine (PH$_3$), and the phosphorus (P) concentration in these regions was set to $1\times10^{20}$ to $1\times10^{21}$ atoms/cm$^3$. In this specification, the concentration of the impurity element imparting the n-type contained in the impurity regions 6038 to 6042 formed here is represented by (n$^+$). (FIG. 12B)

In the impurity regions 6038 to 6042, the phosphorus (P) or boron (B) which was added at the preceding steps are contained, however, as compared with this impurity element concentration, phosphorus is added here at a sufficiently high concentration, so that the influence by the phosphorus (P) or boron (B) added at the preceding steps need not be taken into consideration. Further, the concentration of the phosphorus (P) that is added into the impurity regions 6038 is ½ to ⅓ of the concentration of the boron (B) added at the step shown in FIG. 12A; and thus, the p-type conductivity was secured, and no influence was exerted on the characteristics of the TFTs.

Then, the step of adding an impurity imparting n-type for formation of the LDD regions of the n-channel type TFT in the pixel matrix circuit was carried out. Here, by using the gate electrode 6031 as a mask, the impurity element for imparting n-type was added in a self-alignment manner. The concentration of phosphorus (P) added was $1 \times 10^{16}$ to $5 \times 10^{18}$ atoms/cm$^3$; by thus adding phosphorus at a concentration lower than the concentrations of the impurity elements added at the steps shown in FIG. 11A, FIG. 12A and FIG. 12B, only impurity regions 6043 and 6044 were substantially formed. In this specification, the concentration of the impurity element for imparting the n conductivity type which impurity element is contained in these impurity regions 6043 and 6044 is represented by (n$^-$). (FIG. 12C)

Thereafter, in order to activate the impurity elements, which were added at their respective concentrations for imparting n-type or p-type conductivity, a heat treatment step was carried out. This step can be carried out by furnace annealing, laser annealing or rapid thermal annealing (RTA). Here, the activation step was performed by furnace annealing. Heat treatment is carried out in a nitrogen atmosphere with an oxygen concentration of 1 ppm or less, preferably 0.1 ppm or less, at 400 to 800° C., generally at 500 to 600° C.; in this embodiment, the heat treatment was carried out at 550° C. for 4 hours. Further, in the case a substrate such as a quartz substrate which has heat resistance is used as the substrate 6001, the heat treatment may be carried out at 800° C. for one hour; in this case, the activation of the impurity elements and the junctions between the impurity regions into which the impurity element was added and the channel-forming region could be well formed.

By this heat treatment, on the metal films 6028b to 6032b, which form the gate electrodes 6028 to 6031 and the capacitor wiring 6032, conductive layers (C) 6028c to 6032c are formed with a thickness of 5 to 80 nm as measured from the surface. For example, in the case the conductive layers (B) 6028b to 6032b are made of tungsten (W), tungsten nitride (WN) is formed; in the case of tantalum (Ta), tantalum nitride (TaN) can be formed. In this Embodiment the gate electrode may be formed from: a lamination of silicon (Si) film, WN film and W film; a lamination of W film and W film containing Si; a lamination of W film, W film containing Si and Si; W film containing Mo; or Ta film containing Mo. Further, the conductive layers (C) 6028c to 6032c can be similarly formed by exposing the gate electrodes 6028 to 6031 to a plasma atmosphere containing nitrogen which plasma atmosphere uses nitrogen or ammonia. Further, heat treatment was carried out in an atmosphere containing 3 to 100% of hydrogen at 300 to 450° C. for 1 to 12 hours, thus performing the step of hydrogenating the island semiconductor layers. This step is a step for terminating the dangling bonds of the semiconductor layers by the thermally excited hydrogen. As another means for the hydrogenation, plasma hydrogenation (using the hydrogen excited by plasma) may be performed.

In the case the island semiconductor layers were fabricated by the crystallization method using a catalytic element from an amorphous silicon film, a trace amount of the catalytic element remained in the island semiconductor layers. Of course, it is possible to complete the TFT even in such a state however, it was more preferable to remove the residual catalytic element at least from the channel-forming region. As one of the means for removing this catalytic element, there was the means utilizing the gettering function of phosphorus (P). The concentration of phosphorus (P) necessary to perform gettering is at the same level as that of the impurity region (n$^+$) which was formed at the step shown in FIG. 12B; by the heat treatment at the activation step carried out here, the catalytic element could be gettered from the channel-forming region of the n-channel type and the p-channel type TFTs. (FIG. 12D)

Figure 13A:
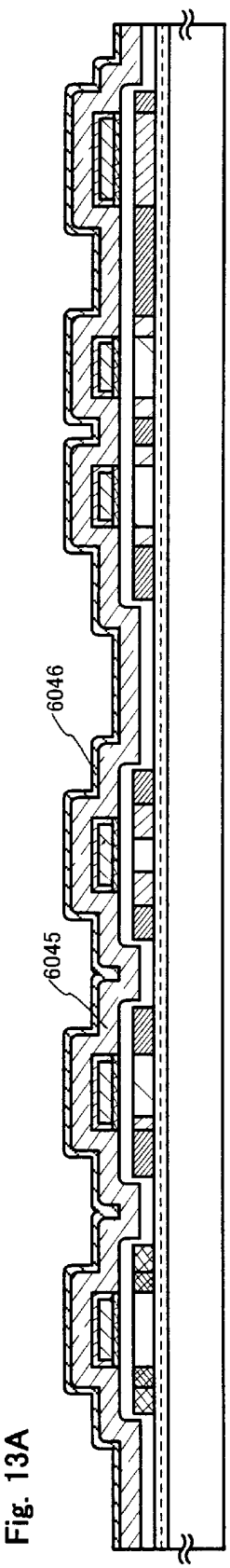
FIGS. 13A to 13C are sectional views showing the manufacturing process of the TFT.
Figure 13B:
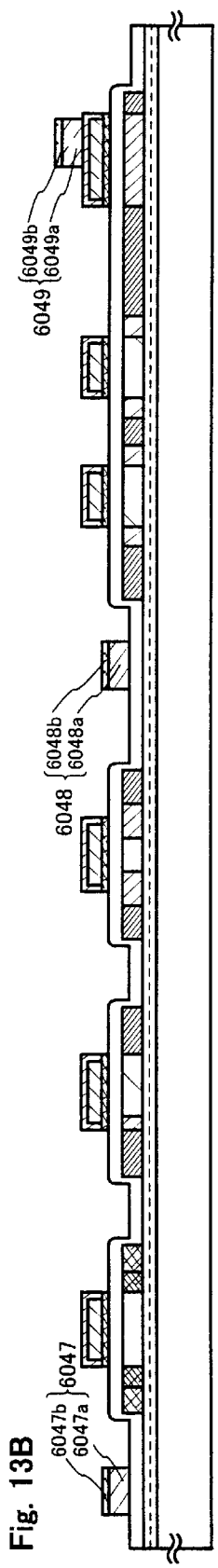

After the activation and hydrogenation steps are over, a second conductive film is formed as gate wiring. This second conductive film is preferably formed of a conductive layer (D) comprised mainly of aluminum (Al) or copper (Cu) that is a low resistance material, and a conductive layer (E) comprised of titanium (Ti), tantalum (Ta), tungsten (W), or molybdenum (Mo). In this embodiment, the second conductive film was formed by using, as the conductive layer (D) 6045, an aluminum (Al) film containing 0.1 to 2 wt % of titanium (Ti) and by using a titanium (Ti) film as the conductive layer (E) 6046. The conductive layer (D) 6045 may be formed to a thickness of 100 to 400 nm (preferably, 250 to 350 nm), while the conductive layer (E) 6046 may be formed to a thickness of 50 to 200 nm (preferably, 100 to 150 nm). (FIG. 13A)

Then, in order to form gate wirings connected to the gate electrodes, the conductive layer (E) 6046 and the conductive layer (D) 6045 were etched, whereby gate wirings 6047 and 6048 and a capacitor wiring 6049 were formed. The etching treatment was carried out in such a manner that, at first, by the dry etching method using a mixture gas consisting of SiCl$_4$, Cl$_2$ and BCl$_3$, the portions extending from the surface of the conductive layer (E) to a part of the way of the conductive layer (D) were removed, and, thereafter, the conductive layer (D) was removed by the wet etching using a phosphoric acid etching solution, whereby the gate wirings could be formed, maintaining a selective workability with respect to the base film.

A first interlayer insulating film 6050 is formed of a silicon oxide film or a silicon oxynitride film with a thickness of 500 to 1500 nm, and contact holes reaching the source regions or the drain regions, which are formed in the respective island semiconductor layers, are formed; and source wirings 6051 to 6054 and drain wirings 6055 to 6058 are formed. Though not shown, in this embodiment, these electrodes were formed from a three-layer structure which was constituted by continuously forming a Ti film with a thickness of 100 nm, an aluminum film containing Ti and having a thickness of 300 nm, and a Ti film with a thickness of 150 nm by sputtering.

Figure 13C:
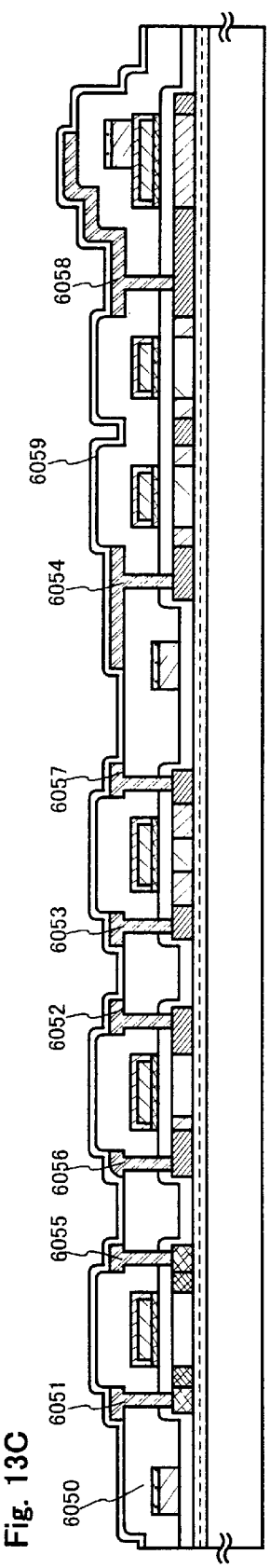

Next, as a passivation film 6059, a silicon nitride film, a silicon oxide film or a silicon oxinitride film is formed to a thickness of 50 to 500 nm (typically, 100 to 300 nm). In the case that a hydrogenating treatment was carried out in this state, a desirable result was obtained in respect of the enhancement in characteristics of the TFTs. For example, it is preferable to carry out heat treatment in an atmosphere containing 3 to 100% of hydrogen at 300 to 450° C. for 1 to 12 hours; or, in the case that the plasma hydrogenation method was employed, a similar effect was obtained. Here, openings may be formed in the passivation film 6059 at the positions at which contact holes for connecting the pixel electrodes and drain wirings to each other will be formed later. (FIG. 13C)

Figure 14:
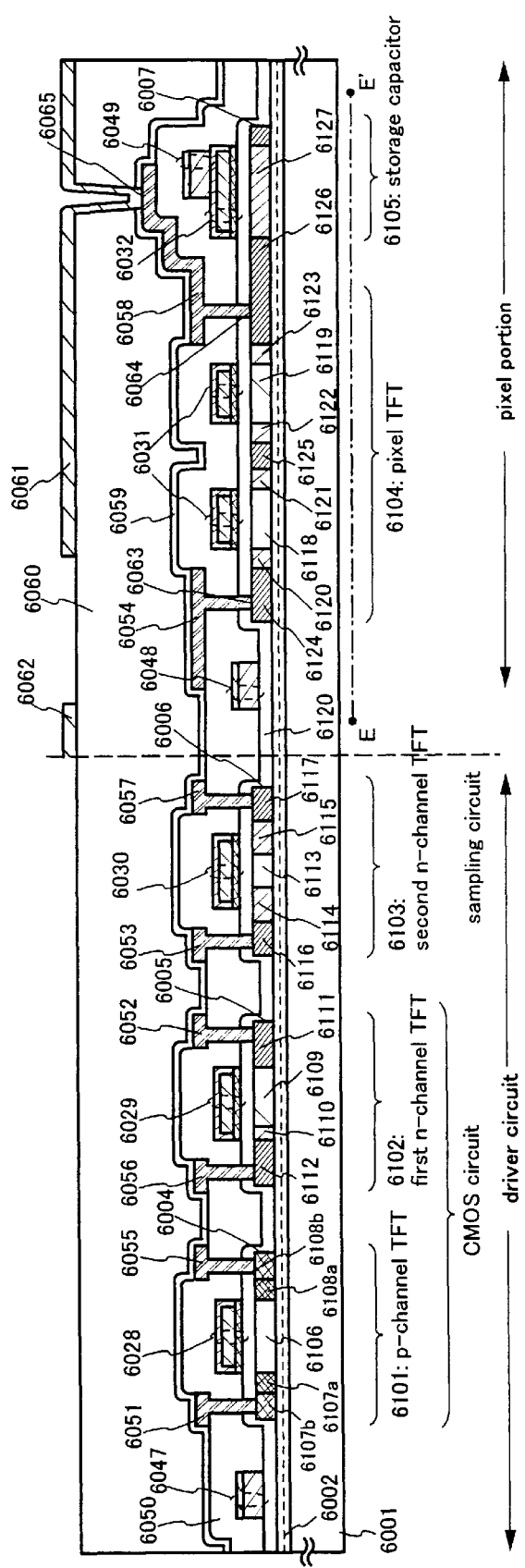
FIG. 14 is a sectional view showing the manufacturing process of the TFT.
Figure 15:
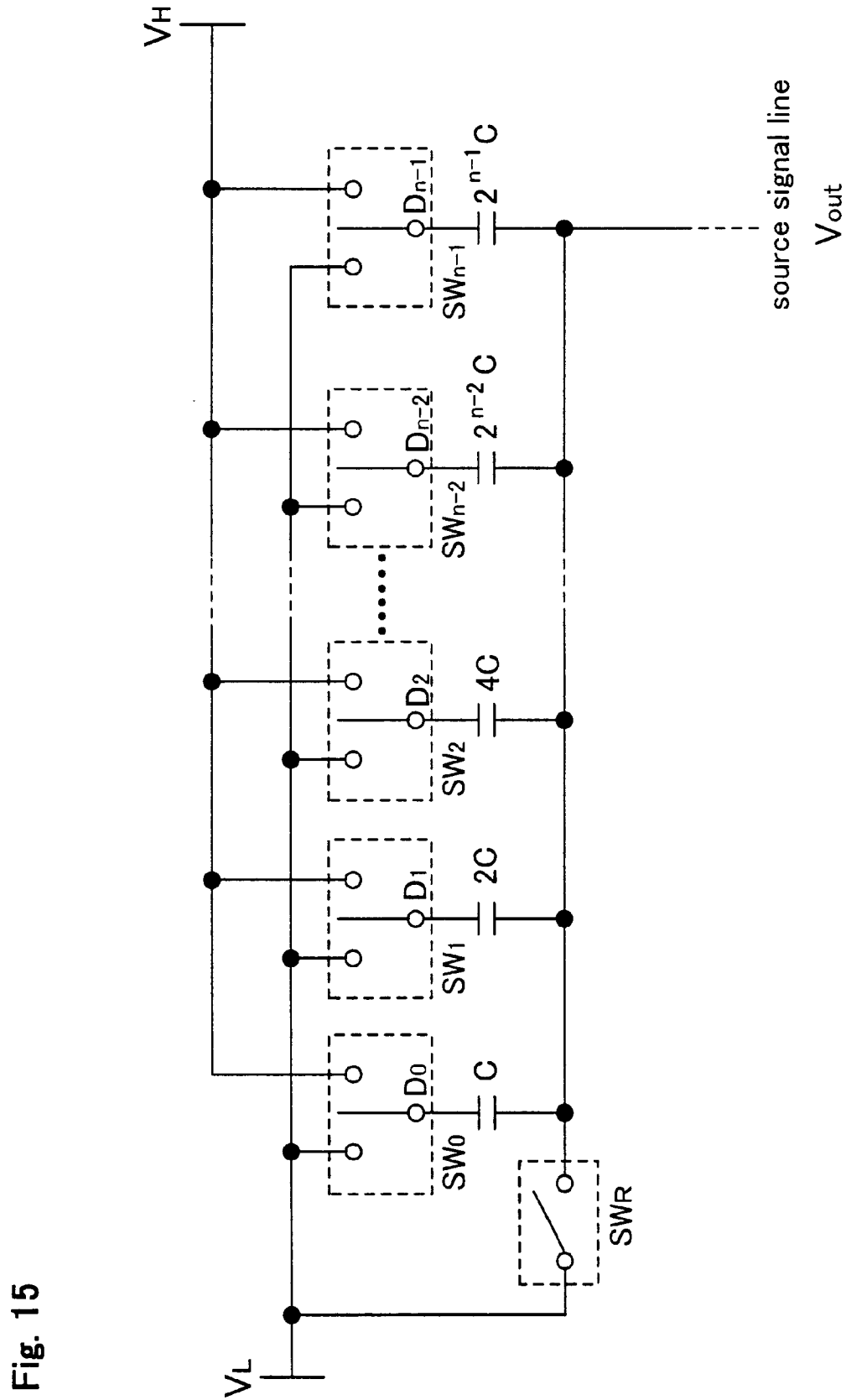
FIG. 15 is a circuit diagram of a conventional DAC.

Thereafter, a second interlayer insulating film 6060 comprised of an organic resin is formed to a thickness of 1.0 to 1.5 μm. As the organic resin, polyimide, acrylic, polyamide, polyimideamide, or BCB (benzocyclobutene), etc., can be used. Here, polyimide of the type that, after applied to the substrate, thermally polymerizes was used; it was fired at 300° C., whereby the second interlayer dielectric film was formed. Then, a contact hole reaching the drain wiring 6058 was formed in the second interlayer insulating film 6060, and pixel electrodes 6061 and 6062 were formed. The pixel electrodes can be formed by using a transparent conductive film in the case a transmission type liquid crystal panel is to be obtained, while, in the case a reflection type liquid crystal panel is to be fabricated, the pixel electrodes can be formed by a metal film. In this embodiment, a transmission type liquid crystal panel is to be fabricated, so that an indium tin oxide (ITO) film was formed to a thickness of 100 nm by sputtering. (FIG. 14)

In this way, a substrate having the TFTs of the driving circuit and the pixel TFTs of the pixel section on the same substrate could be completed. In the driving circuit, there were formed a p-channel TFT 6101, a first n-channel TFT 6102 and a second n-channel TFT 6103, while, in the pixel section, there were formed a pixel TFT 6104 and a storage capacitor 6105. In this specification, such a substrate is called active matrix substrate for convenience.

The p-channel TFT 6101 in the driving circuit has a channel-forming region 6106, source regions 6107a and 6107b and drain regions 6108a and 6108b in the island semiconductor layer 6004. The first n-channel TFT 6102 has a channel-forming region 6109, an LDD region 6110 overlapping the gate electrode 6029 (such an LDD region will hereinafter be referred to as Lov), a source region 6111 and a drain region 6112 in the island semiconductor layer 6005. The length in the channel direction of this Lov region is set to 0.5 to 3.0 μm, preferably 1.0 to 1.5 μm. A second n-channel TFT1 6103 has a channel-forming region 6113, LDD regions 6114 and 6115, a source region 6116 and a drain region 6117 in the island semiconductor layer 6006. As these LDD regions, there are formed an Lov region and an LDD region which does not overlap the gate electrode 6030 (such an LDD region will hereafter be referred as Loff); and the length in the channel direction of this Loff region is 0.3 to 2.0 μm, preferably 0.5 to 1.5 μm. The pixel TFT 6104 has channel-forming regions 6118 and 6119, Loff regions 6120 to 6123, and source or drain regions 6124 to 6126 in the island semiconductor layer 6007. The length in the channel direction of the Loff regions is 0.5 to 3.0 μm, preferably 1.5 to 2.5 μm. Further, the storage capacitor 6105 comprises capacitor wirings 6032 and 6049, an insulator film composed of the same material as the gate insulator film and a semiconductor layer 6127 which is connected to the drain region 6126 of the pixel TFT 6104 and in which an impurity element for imparting the n conductivity type is added. In FIG. 14, the pixel TFT 6104 is of the double gate structure, but may be of the single gate structure, or may be of a multi-gate structure in which a plurality of gate electrodes are provided.

As described above, in this embodiment, the structure of the TFTs constituting the respective circuits can be optimized in accordance with the specifications required by the pixel TFTs and the driving circuits; and thus, the operating performance and the reliability of the semiconductor device can be enhanced. Further, since the gate electrodes are formed of a conductive material that has heat resistance, the activation of the LDD regions, the source regions and the drain regions can be easily realized, and, by forming the gate wirings of a low resistance material, the wiring resistance can be sufficiently lowered. Accordingly, the gate electrodes can be applied even to a display device in which the diagonal screen size of the pixel portion is in the 4-inch class or greater.

EMBODIMENT 4

CMOS circuits and pixel matrix circuit formed in accordance with the present invention can be used in various electrooptical devices (active matrix type liquid crystal display or active matrix type EL display). In other words, the present invention can be applied to all of the electronic appliances having these electrooptical devices as the display section.

The following can be given as examples of this type of electronic appliances: video cameras; digital cameras; projectors (rear type or front type); head mounted displays (goggle type display); game machines; car navigation systems; car stereo; personal computers; portable information terminals (such as mobile computers, portable telephones and electronic notebook). Some examples of these are shown in FIGS. 17A to 17F, 18A to 18D and 19A to 19C.

Figure 17A:
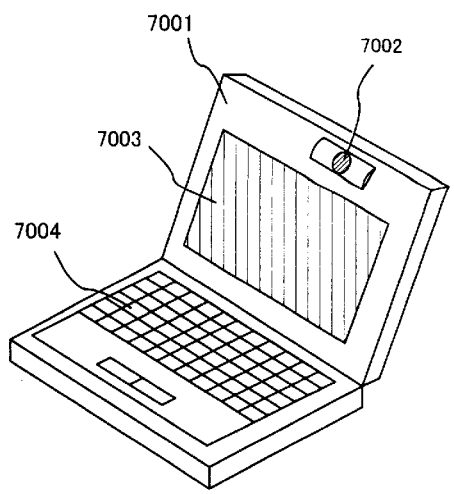
FIGS. 17A to 17F are views showing examples of electronic appliances using the DAC of the present invention.

FIG. 17A is a personal computer, which comprises: a main body 7001; an image input section 7002; a display device 7003; and a keyboard 7004. The present invention may be applied to the image input section 7002, display device 7003 or other signal control circuits.

Figure 17B:
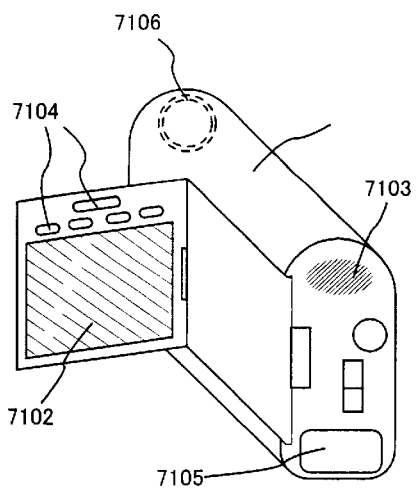

FIG. 17B is a video camera, which comprises a main body 7101; a display device 7102; a voice input section 7103; operation switches 7104; a battery 7105; and an image receiving section 7106. The present invention can be applied to the display device 7102 or other signal control circuits.

Figure 17C:
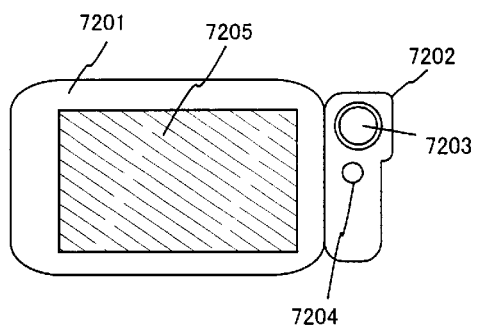

FIG. 17C is a mobile computer, which comprises: a main body 7201; a camera section 7202; an image receiving section 7203; operation switches 7204; and a display device 7205. The present invention can be applied to the display device 7205 or other signal control circuits.

Figure 17D:
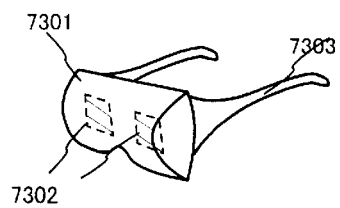

FIG. 17D is a goggle type display, which comprises a main body 7301; display devices 7302; and arm sections 7303. The present invention can be applied to the display device 7302 or other signal control circuits.

Figure 17E:
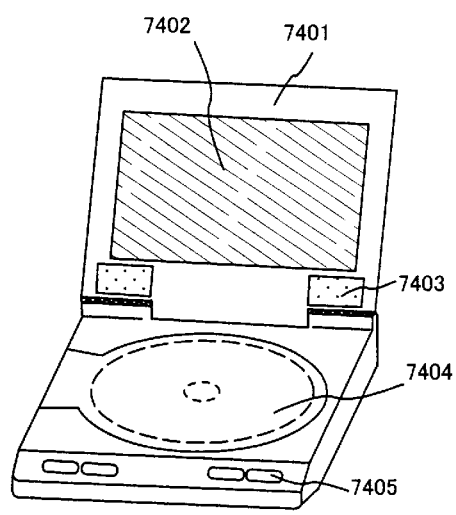

FIG. 17E is a player that uses a recording medium on which a program is recorded (hereinafter referred to as a recording medium), which comprises: a main body 7401; a display device 7402; a speaker section 7403; a recording medium 7404; and operation switches 7405. Note that music appreciation, film appreciation, games, and the use of the Internet can be performed with this device using a DVD (digital versatile disk), a CD, etc., as a recording medium. The present invention can be applied to the display device 7402, or to other signal control circuits.

Figure 17F:
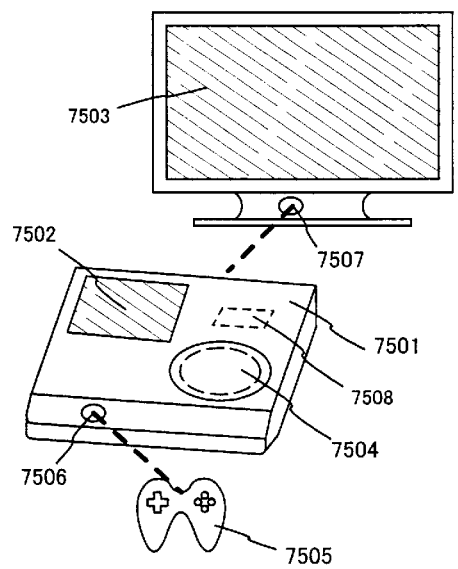

FIG. 17F is a game machine which comprises a main body 7501, a display device for the main body 7502, a display device 7503, a recording medium 7504, a controller 7505, a sensor unit for the main body 7506, a sensor unit 7507 and a CPU unit 7508. The sensor unit for the main body 7506 and the sensor unit 7507 are capable of sensing infrared rays emitted from the controller 7505 and the main body 7501 respectively. The present invention can be applied to the display device fir the main body 7502, the display device 7503 or other signal control circuits.

Figure 18A:
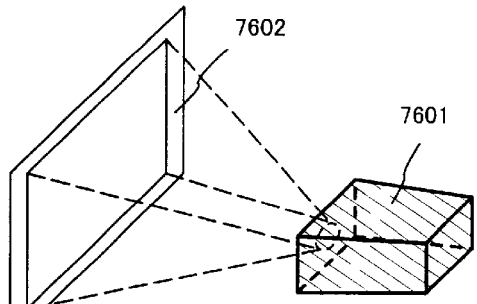
FIGS. 18A to 18D are views of projectors using the DAC of the present invention.

FIG. 18A is a front type projector, which comprises an optical light source system and a display device 7601 and screen 7602. The present invention can be applied to the display device or other signal control circuits.

Figure 18B:
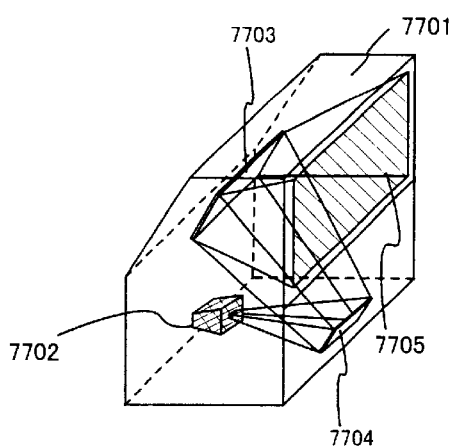

FIG. 18B is a rear type projector, which comprises: a main body 7701; an optical light source system and display device 7702; a mirror 7703; a mirror 7704; and a screen 7705. The present invention can be applied to the display device or other signal control circuits.

Figure 18C:
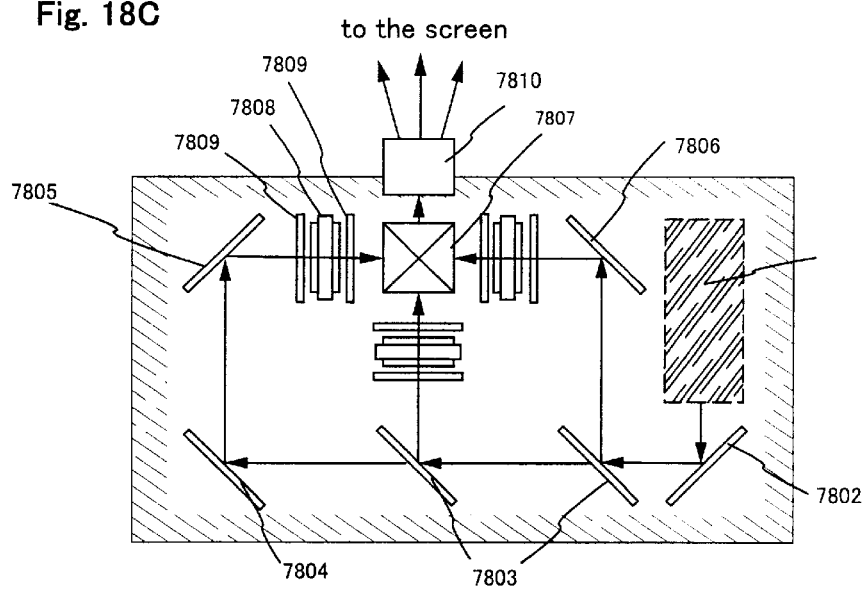

Note that FIG. 18C is a drawing showing one example of the structure of the optical light source system and display device 7601 and 7702 of FIGS. 18A and 18B. The optical light source system and display device 7601 and 7702 comprise: an optical light source system 7801; mirrors 7802 and 7804 to 7806; dichroic mirror 7803; an optical system 7807; a display device 7808; phase differentiating plate 7809; and an optical projection system 7810. The optical projection system 7810 is composed of a plurality of optical lenses provided with a projection lens. Further, the operator may set optical systems such as optical lenses, film having polarizing function, film to regulate the phase difference, IR films, etc., suitably within the optical path shown by an arrow in FIG. 18C.

Figure 18D:
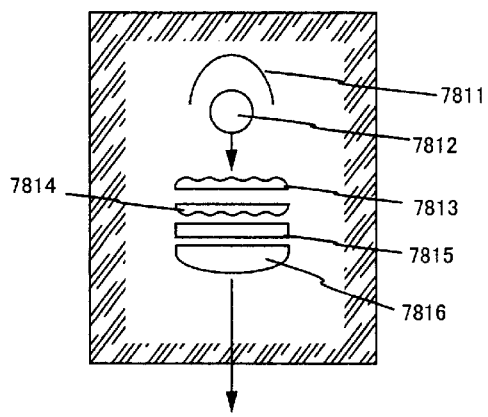

In addition, FIG. 18D shows one example of the structure of the optical light source system 7801 from FIG. 18C. In this embodiment, the optical light source system 7801 comprises: a reflector 7811; a light source 7812; lens arrays 7813 and 7814; a polarizing conversion element 7815; and a condensing lens 7816. Note that the optical light source shown in FIG. 18D is merely an example and is not specifically limited to this structure. For example, the operator may suitably place optical lenses, film having polarizing function, film to regulate the phase difference, IR films, etc.

Figure 19A:
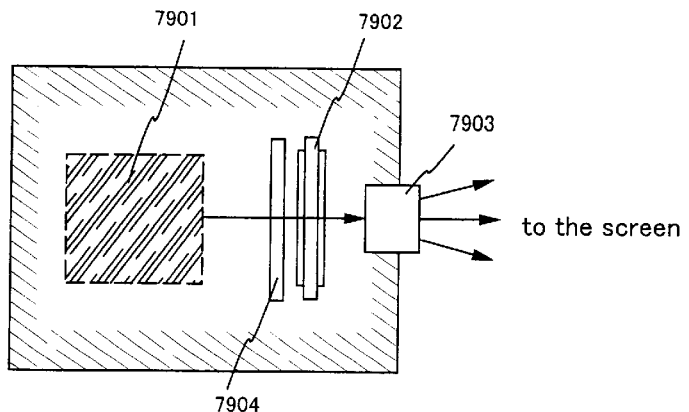
FIGS. 19A to 19C are views of projectors using the DAC of the present invention.

While FIG. 18C is an example of three plate type, FIG. 19A shows a drawing showing an example of single plate type. The optical light source system and display device shown in FIG. 19A comprises: an optical light source system 7901; a display device 7902; and a projection optical system 7903. The projection optical system 7903 comprises an optical by lens provided with a projection lens. The optical light source system and display device shown in FIG. 19A can be applied to the optical light source system and display devices 7601 and 7702 of FIGS. 18A and 18B. Further, an optical light source system shown in FIG. 18D may be used for the optical light source system 7901. Note that a color filter is provided on the display device 7902 (not shown) which makes the displayed image colored.

Figure 19B:
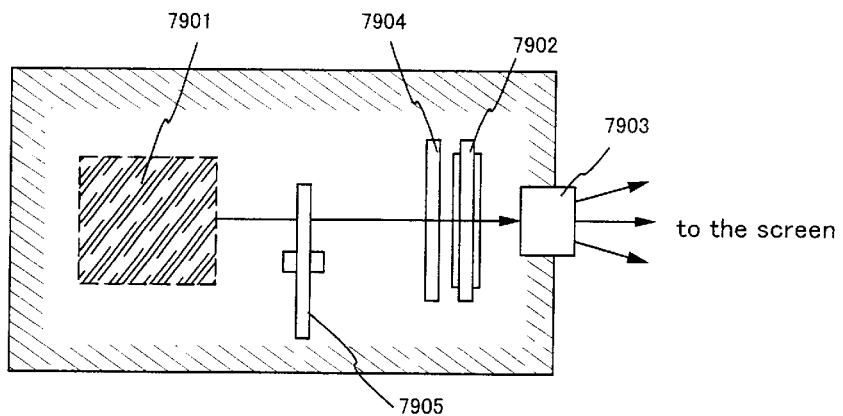

Further, the optical light source system and display device shown in FIG. 19B is an application example of FIG. 19A which uses a color filter disk of RGB 7905 in place of the color filter for coloring the displayed image. The optical light source system and display device shown in FIG. 19B can be applied to the optical light source system and display devices 7601 and 7702 of FIGS. 18A and 18B.

Figure 19C:
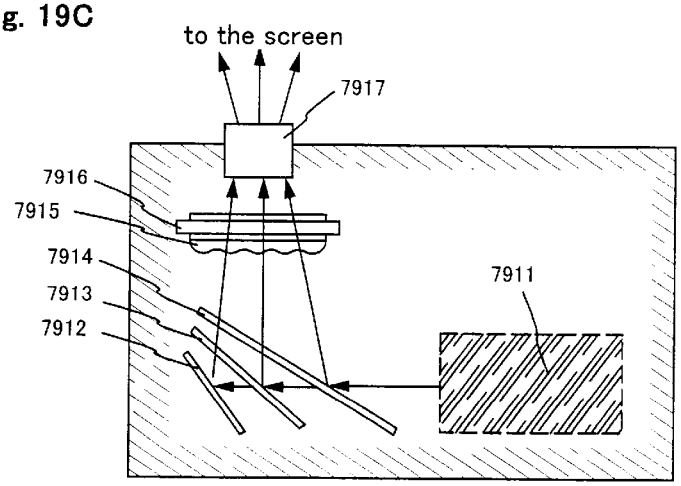

Further, the optical light source system and display device shown in FIG. 19C is referred to color filter-less single plate type. This system provides a micro lens array 7915 in the display device 7916 and colors the displayed image by using dichroic mirror (green) 7912, dichroic mirror (red) 7913 and dichroic mirror (blue) 7914. The projection optical system 7917 comprises a plurality of optical lenses provided with a projection lens. The optical light source system and display device shown in 19C can be applied to the optical light source system and display devices 7601 and 7702 of FIGS. 18A and 18B. Further, the optical light source system 7911 may use an optical system using a coupling lens and a collimator lens in addition to the light source.

As shown above, the applicable range of the present invention is extremely wide, and it is possible to apply the present invention to electronic appliance in all fields.

As described above, since the present invention has the foregoing structure, it has become possible to convert a 2-bit digital signal into an analog signal by the DAC using n capacitors and one coupling capacitor $C_k$. Thus, the size of the DAC can be made about half of the size of a conventional DAC. As a result, it becomes possible to lessen the area of a driving circuit, and it has become possible to make a liquid crystal panel included in an active matrix type liquid crystal display device thin and lightweight. Besides, even if the number of source signal lines is increased and the number of D/A conversion circuits is increased, since the area of the D/A conversion circuit can be made small in the present invention, it is possible to prevent the increase in the area of the driving circuit due to the high precision as compared with the case using a conventional DAC.

What is claimed is:

1. A semiconductor device which comprises a source signal line driver circuit, a gate signal line driver circuit and a pixel section, wherein the source signal line driver circuit comprises a D/A converter circuit which converts a 2n bit digital signal into an analog signal, which comprises n switches, n capacitors and a coupling capacitor, where n is a natural number, wherein:

upper n bit of the digital signal control n switches respectively and control charging and discharging of electric charge into said n capacitors and said n capacitors are connected to the output line in an upper bit writing period; and lower n bit of the digital signal control said n switches and control charging and discharging of electric charge into said n capacitors and said n capacitors are connected to said output line through said coupling capacitor in a lower bit writing period.

2. A semiconductor device according to claim 1, wherein a power source electric potential $V_L$ of said first power source is lower than a power source electric potential $V_H$ of said second power source.

3. A semiconductor device according to claim 1, wherein said switch comprises a thin film transistor.

4. A semiconductor device according to claim 1, wherein said semiconductor device is one selected from a group consisting of a rear projector, a front projector, a goggle type display, a mobile computer, a notebook type personal computer, a video camera, a DVD player, a game machine, a digital camera, a portable telephone and an electronic book.

5. A semiconductor device which comprises a source signal line driver circuit, a gate signal line driver circuit and a pixel section, wherein the source signal line driver circuit comprises a D/A converter circuit which converts 2n bit digital signal into analog signal, which comprises n switches, n capacitors and a coupling capacitor, where n is a natural number, wherein:

in a first period, one electrode among 2 electrodes which comprise each of said n capacitors is connected to a first power source and the other electrode is connected to a third power source;

in a second period, upper n bit of said digital signal respectively control n switches and said one electrode is connected to said first power source or a second power source and said other electrode is connected to an output line;

in a third period, said one electrode is connected to the first power source and said other electrode is floated; and in a fourth period, lower n bit of said digital signal respectively control n switches and said one electrode is connected to the first power source or said second power source and said other electrode is connected to said output line.

6. A semiconductor device according to claim 5, wherein said switch comprises a thin film transistor.

7. A semiconductor device according to claim 5, wherein said semiconductor device is one selected from a group consisting of a rear projector, a front projector, a goggle type display, a mobile computer a notebook type personal computer, a video camera, a DVD player, a game machine, a digital camera, a portable telephone and an electronic book.

8. A semiconductor device which comprises a source signal line driver circuit, a gate signal line driver circuit and a pixel section, wherein the source signal line driver circuit comprises a D/A converter circuit which converts a 2n bit digital signal into an analog signal, said D/A converter circuit comprising:

n switches, n capacitors and a coupling capacitor, where n is a natural number, wherein said n capacitors are connected to an output line in an upper bit writing period, and wherein said n capacitors are connected to said output line through said coupling capacitor in a lower bit writing period.

9. A semiconductor device according to claim 8, wherein said semiconductor device is one selected from a group consisting of a rear projector, a front projector, a goggle type display, a mobile computer, a notebook type personal computer, a video camera, a DVD player, a game machine, a digital camera, a portable telephone and an electronic book.

* * * * *